United States Patent
Broughton et al.

(10) Patent No.: US 9,934,885 B2
(45) Date of Patent: *Apr. 3, 2018

(54) ELECTRICAL HARNESS

(71) Applicant: ROLLS-ROYCE PLC, London (GB)

(72) Inventors: Paul Broughton, Leicester (GB); Robin Charles Kennea, Nottingham (GB)

(73) Assignee: ROLLS-ROYCE plc, London (GB)

( * ) Notice: Subject to any disclaimer, the term of this patent is extended or adjusted under 35 U.S.C. 154(b) by 0 days.

This patent is subject to a terminal disclaimer.

(21) Appl. No.: 13/716,497

(22) Filed: Dec. 17, 2012

(65) Prior Publication Data
US 2013/0161093 A1 Jun. 27, 2013

(30) Foreign Application Priority Data

Dec. 22, 2011 (GB) .................................. 1122140.5

(51) Int. Cl.
*H01B 7/00* (2006.01)
*H01B 7/17* (2006.01)
(Continued)

(52) U.S. Cl.
CPC ............. *H01B 7/0045* (2013.01); *F02C 7/00* (2013.01); *F02C 7/32* (2013.01); *H01B 7/17* (2013.01);
(Continued)

(58) Field of Classification Search
CPC ....... H01B 7/0045; F02C 7/32; Y02T 50/672; B60R 16/0207; H01R 12/78; H01R 12/61;
(Continued)

(56) References Cited

U.S. PATENT DOCUMENTS 2,523,083 A 9/1950 Witkowski
2,523,504 A 9/1950 Ford, Jr.
(Continued)

FOREIGN PATENT DOCUMENTS

DE 2941950 B1 2/1981
DE 102009047334 A1 6/2011
(Continued)

OTHER PUBLICATIONS

Apr. 20, 2012 Search Report issued in British Patent Application No. GB1122140.5.
(Continued)

*Primary Examiner* — Ishwarbhai B Patel
*Assistant Examiner* — Paresh Paghadal
(74) *Attorney, Agent, or Firm* — Oliff PLC

(57) ABSTRACT

A gas turbine engine 10 is provided with electrical harness rafts 200 comprising electrical conductors embedded in a rigid composite material. The rafts 200 are used to transport electrical signals (which may be, for example power and/or control signals) around a gas turbine engine. Rafts 200 may be connected together and to other components using flexible cables, that may help to accommodate relative movement of the rafts 200, for example through vibration. The rafts 200 are lighter, more compact, and more convenient to handle than conventional electrical harnesses. The rafts 200 may provide a convenient and secure mounting surface for other components/systems of a gas turbine engine, such as EECs and/or fluid pipes.

14 Claims, 9 Drawing Sheets

(51) Int. Cl.
*H01B 7/282* (2006.01)
*H05K 1/00* (2006.01)
*H05K 1/18* (2006.01)
*F02C 7/32* (2006.01)
*F02C 7/00* (2006.01)
*H01R 12/78* (2011.01)
*H01R 12/61* (2011.01)
*H05K 1/14* (2006.01)

(52) U.S. Cl.
CPC .............. *H01B 7/282* (2013.01); *H05K 1/00* (2013.01); *H05K 1/18* (2013.01); *H01R 12/61* (2013.01); *H01R 12/78* (2013.01); *H05K 1/144* (2013.01); *H05K 1/147* (2013.01); *H05K 2201/058* (2013.01); *H05K 2201/10295* (2013.01); *Y02T 50/672* (2013.01)

(58) Field of Classification Search
CPC ... H05K 2201/058; H05K 2201/10242; H05K 2201/10295; H05K 2201/10303; H05K 1/144; H05K 1/147
See application file for complete search history.

(56) References Cited

U.S. PATENT DOCUMENTS

| | | | |
|---|---|---|---|
| 2,866,522 A | 12/1958 | Morley | |
| 2,877,544 A | 3/1959 | Gammel | |
| 2,963,538 A | 12/1960 | Dahlgren | |
| 3,086,071 A | 4/1963 | Preston | |
| 3,128,214 A * | 4/1964 | Lay | 264/258 |
| 3,168,617 A | 2/1965 | Richter | |
| 3,284,003 A | 11/1966 | Ciemochowski | |
| 3,494,657 A | 2/1970 | Harper et al. | |
| 3,612,744 A | 10/1971 | Thomas | |
| 3,700,825 A | 10/1972 | Taplin et al. | |
| 3,710,568 A | 1/1973 | Rice | |
| 4,137,888 A | 2/1979 | Allan | |
| 4,149,567 A | 4/1979 | Weirich | |
| 4,180,608 A | 12/1979 | Del | |
| 4,220,912 A | 9/1980 | Williams | |
| 4,488,970 A | 12/1984 | Clark | |
| 4,533,787 A | 8/1985 | Anderegg et al. | |
| 4,652,064 A | 3/1987 | Cetrone | |
| 4,671,593 A | 6/1987 | Million-Fremillon et al. | |
| 4,846,405 A * | 7/1989 | Zimmermann .. A61B 17/00491 | 229/171 |
| 5,004,639 A | 4/1991 | Desai | |
| 5,012,639 A | 5/1991 | Ream et al. | |
| 5,031,396 A | 7/1991 | Margnelli | |
| 5,048,747 A | 9/1991 | Clark et al. | |
| 5,091,605 A | 2/1992 | Clifford | |
| 5,097,390 A | 3/1992 | Gerrie et al. | |
| 5,138,784 A | 8/1992 | Niwa | |
| 5,142,448 A | 8/1992 | Kober et al. | |
| 5,174,110 A * | 12/1992 | Duesler et al. | 60/226.1 |
| 5,249,417 A | 10/1993 | Duesler et al. | |
| 5,435,124 A | 7/1995 | Sadil et al. | |
| 5,509,599 A | 4/1996 | Laue | |
| 5,688,145 A | 11/1997 | Liu | |
| 5,691,509 A * | 11/1997 | Balzano ................. H01R 12/62 | 174/117 F |
| 5,692,909 A | 12/1997 | Gadzinski | |
| 5,795,172 A | 8/1998 | Shahriari et al. | |
| 5,870,824 A | 2/1999 | Lilja et al. | |
| 5,876,013 A | 3/1999 | Ott | |
| 5,885,111 A | 3/1999 | Yu | |
| 5,895,889 A * | 4/1999 | Uchida et al. ............. 174/72 A | |
| 6,050,853 A | 4/2000 | Ando et al. | |
| 6,148,500 A | 11/2000 | Krone et al. | |
| 6,157,542 A | 12/2000 | Wu | |
| 6,328,010 B1 * | 12/2001 | Thurman ................. F02P 13/00 | 123/143 C |
| 6,344,616 B1 * | 2/2002 | Yokokawa ............... H01B 7/00 | 174/117 F |
| 6,399,889 B1 | 6/2002 | Korkowski et al. | |
| 6,434,473 B1 * | 8/2002 | Hattori ......................... 701/100 | |
| 6,481,101 B2 | 11/2002 | Reichinger | |
| 6,588,820 B2 | 7/2003 | Rice | |
| 6,689,446 B2 | 2/2004 | Barnes et al. | |
| 6,702,607 B2 * | 3/2004 | Kondo ......................... 439/498 | |
| 6,849,805 B2 | 2/2005 | Honda et al. | |
| 6,969,807 B1 | 11/2005 | Lin et al. | |
| 6,971,650 B2 | 12/2005 | Marelja | |
| 6,971,841 B2 | 12/2005 | Care | |
| 7,002,269 B2 | 2/2006 | Angerpointer | |
| 7,010,906 B2 | 3/2006 | Cazenave et al. | |
| 7,232,315 B2 | 6/2007 | Uchida et al. | |
| 7,281,318 B2 | 10/2007 | Marshall et al. | |
| 7,316,390 B2 | 1/2008 | Burlison | |
| 7,389,977 B1 | 6/2008 | Fernandez et al. | |
| 7,414,189 B2 | 8/2008 | Griess | |
| 7,500,644 B2 | 3/2009 | Naudet et al. | |
| 7,506,499 B2 | 3/2009 | Fert et al. | |
| 7,516,621 B2 | 4/2009 | Suttie et al. | |
| 7,525,816 B2 | 4/2009 | Sawachi | |
| 7,543,442 B2 | 6/2009 | Derenes et al. | |
| 7,592,546 B2 | 9/2009 | Johansson | |
| 7,661,272 B2 | 2/2010 | Gagneux et al. | |
| 7,719,378 B2 * | 5/2010 | Blair ......................... H01P 3/006 | 333/1 |
| 7,745,730 B2 | 6/2010 | Bailey | |
| 7,762,502 B2 | 7/2010 | Mesing et al. | |
| 7,837,497 B1 | 11/2010 | Matsuo et al. | |
| 7,862,348 B2 * | 1/2011 | Strauss .................... H01R 4/56 | 29/833 |
| 8,038,104 B1 | 10/2011 | Larkin | |
| 8,137,524 B2 | 3/2012 | Berggren et al. | |
| 8,317,524 B2 | 11/2012 | Bailey | |
| 8,491,013 B2 | 7/2013 | Peer et al. | |
| 8,581,103 B2 * | 11/2013 | Aspas Puertolas .... H05K 1/142 | 174/251 |
| 8,794,584 B2 | 8/2014 | Shimada et al. | |
| 8,932,066 B2 | 1/2015 | Broughton | |
| 8,937,254 B2 * | 1/2015 | Wen ......................... B64C 3/185 | 174/113 R |
| 9,010,716 B2 | 4/2015 | Kobori | |
| 9,040,821 B2 | 5/2015 | Blanchard et al. | |
| 9,139,144 B2 | 9/2015 | Broughton | |
| 9,259,808 B2 | 2/2016 | Broughton et al. | |
| 9,338,830 B2 | 5/2016 | Broughton et al. | |
| 9,456,472 B2 | 9/2016 | Dalton et al. | |
| 2002/0046870 A1 | 4/2002 | Zein et al. | |
| 2002/0084382 A1 | 7/2002 | Crist | |
| 2002/0086586 A1 | 7/2002 | Shi et al. | |
| 2002/0170729 A1 | 11/2002 | Murakami et al. | |
| 2002/0170740 A1 | 11/2002 | Yamanobe et al. | |
| 2003/0095389 A1 | 5/2003 | Samant et al. | |
| 2003/0155467 A1 | 8/2003 | Petrenko | |
| 2003/0183733 A1 | 10/2003 | Pisczak | |
| 2004/0065092 A1 | 4/2004 | Wadia et al. | |
| 2004/0266266 A1 | 12/2004 | Lai | |
| 2004/0266274 A1 * | 12/2004 | Naudet ..................... F02C 7/222 | 439/719 |
| 2005/0257956 A1 | 11/2005 | Marshall et al. | |
| 2006/0272340 A1 | 12/2006 | Petrenko | |
| 2006/0278423 A1 * | 12/2006 | Ichikawa ............ B60R 16/0215 | 174/72 A |
| 2007/0018057 A1 | 1/2007 | Kovac | |
| 2007/0029454 A1 | 2/2007 | Suttie et al. | |
| 2007/0084216 A1 | 4/2007 | Mazeaud et al. | |
| 2007/0129902 A1 | 6/2007 | Orbell | |
| 2007/0170312 A1 | 7/2007 | Al-Khalil | |
| 2007/0234559 A1 | 10/2007 | Tokuda et al. | |
| 2008/0128048 A1 | 6/2008 | Johnson et al. | |
| 2008/0179448 A1 | 7/2008 | Layland et al. | |
| 2008/0185478 A1 | 8/2008 | Dannenberg | |
| 2008/0245932 A1 * | 10/2008 | Prellwitz et al. ................ 248/49 | |
| 2009/0067979 A1 | 3/2009 | Braley et al. | |
| 2009/0072091 A1 | 3/2009 | Al-Khalil | |
| 2009/0095842 A1 | 4/2009 | Gaertner, II et al. | |
| 2009/0134272 A1 | 5/2009 | Vauchel | |

(56) References Cited

U.S. PATENT DOCUMENTS

| | | |
|---|---|---|
| 2009/0189051 A1 | 7/2009 | Love |
| 2009/0230650 A1 | 9/2009 | Mayen et al. |
| 2009/0242703 A1 | 10/2009 | Alexander et al. |
| 2009/0277578 A1 | 11/2009 | Sung et al. |
| 2009/0289232 A1 | 11/2009 | Rice |
| 2010/0162726 A1 | 7/2010 | Robertson et al. |
| 2010/0261365 A1 | 10/2010 | Sakakura |
| 2010/0293987 A1 | 11/2010 | Horst et al. |
| 2010/0308169 A1 | 12/2010 | Blanchard et al. |
| 2011/0011627 A1 | 1/2011 | Aspas Puertolas |
| 2011/0014803 A1 | 1/2011 | Bailey |
| 2011/0016882 A1 | 1/2011 | Woelke et al. |
| 2011/0017879 A1 | 1/2011 | Woelke et al. |
| 2011/0053468 A1 | 3/2011 | Vontell |
| 2011/0056961 A1 | 3/2011 | Amtmann et al. |
| 2011/0111616 A1 | 5/2011 | Chang et al. |
| 2011/0120748 A1 | 5/2011 | Bailey |
| 2011/0236182 A1 | 9/2011 | Wiebe et al. |
| 2011/0271655 A1 | 11/2011 | Poisson |
| 2011/0315830 A1 | 12/2011 | Eshima et al. |
| 2012/0012710 A1 | 1/2012 | Yamaguchi et al. |
| 2012/0103685 A1* | 5/2012 | Blanchard ............ H02G 3/0431 174/72 A |
| 2012/0111614 A1* | 5/2012 | Free .............................. 174/257 |
| 2012/0149232 A1 | 6/2012 | Balzano |
| 2012/0312022 A1 | 12/2012 | Lam et al. |
| 2013/0048344 A1* | 2/2013 | Lou ...................... H05K 1/0237 174/251 |
| 2013/0092434 A1 | 4/2013 | Kato et al. |
| 2013/0160458 A1 | 6/2013 | Willmot et al. |
| 2013/0160460 A1 | 6/2013 | Dalton et al. |
| 2013/0160464 A1 | 6/2013 | Maszczk et al. |
| 2013/0189868 A1 | 7/2013 | Fitt et al. |
| 2013/0316147 A1 | 11/2013 | Douglas et al. |
| 2014/0208712 A1 | 7/2014 | Dowdell |
| 2014/0208770 A1 | 7/2014 | Fitt et al. |
| 2014/0290271 A1 | 10/2014 | Dalton |
| 2014/0305134 A1 | 10/2014 | Amarasinghe et al. |
| 2014/0305136 A1 | 10/2014 | Taylor |
| 2014/0325992 A1 | 11/2014 | Summerfield |
| 2014/0325993 A1 | 11/2014 | Broughton et al. |
| 2014/0325994 A1 | 11/2014 | Dowdell et al. |
| 2014/0326058 A1 | 11/2014 | Broughton |
| 2014/0327299 A1 | 11/2014 | Broughton et al. |
| 2014/0328030 A1 | 11/2014 | Broughton |
| 2015/0342022 A1 | 11/2015 | Willmot et al. |
| 2016/0056578 A1 | 2/2016 | Taylor |
| 2016/0057873 A1 | 2/2016 | Richardson et al. |
| 2016/0069213 A1 | 3/2016 | Fitt et al. |
| 2016/0072210 A1 | 3/2016 | Armstrong et al. |
| 2016/0096288 A1 | 4/2016 | Dowdell |

FOREIGN PATENT DOCUMENTS

| | | | |
|---|---|---|---|
| EP | 1741879 A1 | 1/2007 | |
| EP | 1 760 291 A2 | 3/2007 | |
| EP | 1 762 714 A2 | 3/2007 | |
| EP | 2279852 A1 | 2/2011 | |
| EP | 2 590 270 A2 | 5/2013 | |
| FR | 2871284 A1 | 12/2005 | |
| GB | 1260339 A | 1/1972 | |
| GB | 2152147 A | 7/1985 | |
| GB | 2477337 A | 8/2011 | |
| JP | A-63-285808 | 11/1988 | |
| JP | A-4-167376 | 6/1992 | |
| JP | A-4-223067 | 8/1992 | |
| JP | A-5-129040 | 5/1993 | |
| JP | A-2000-299151 | 10/2000 | |
| WO | 0210587 A1 | 2/2002 | |
| WO | WO 2009118561 A1 * | 10/2009 | |
| WO | WO 2010/075390 A2 | 7/2010 | |
| WO | WO 2011/061074 A1 | 5/2011 | |
| WO | WO 2011/117609 | 9/2011 | |
| WO | WO 2011/127996 A1 | 10/2011 | |

OTHER PUBLICATIONS

Apr. 19, 2012 Search Report issued in British Patent Application No. GB1122143.9.
Jun. 21, 2012 Search Report issued in British Patent Application No. GB1203991.3.
Jul. 31, 2012 Search Report issued in British Patent Application No. GB1207733.5.
Aug. 7, 2012 Search Report issued in British Patent Application No. GB1207735.0.
Oct. 23, 2012 Search Report issued in British Patent Application No. GB1212221.4.
Nov. 7, 2012 Search Report issued in British Patent Application No. GB1212223.0.
Broughton et al., Pending U.S. Appl. No. 13/716,648, filed Dec. 17, 2012.
Broughton et al., Pending U.S. Appl. No. 13/716,439, filed Dec. 17, 2012.
Broughton et al., Pending U.S. Appl. No. 13/716,254, filed Dec. 17, 2012.
Willmot et al., Pending U.S. Appl. No. 13/716,300, filed Dec. 17, 2012.
Willmot et al., Pending U.S. Appl. No. 13/716,239, filed Dec. 17, 2012.
Broughton et al., Pending U.S. Appl. No. 13/716,587, filed Dec. 17, 2012.
Maszczk et al., Pending U.S. Appl. No. 13/716,796, filed Dec. 17, 2012.
Willmot et al., Pending U.S. Appl. No. 13/716,808, filed Dec. 17, 2012.
Broughton et al., Pending U.S. Appl. No. 13/716,708, filed Dec. 17, 2012.
Dalton et al., Pending U.S. Appl. No. 13/716,244, filed Dec. 17, 2012.
Broughton et al., Pending U.S. Appl. No. 13/716,503, filed Dec. 17, 2012.
Broughton et al., Pending U.S. Appl. No. 13/716,516, filed Dec. 17, 2012.
Apr. 23, 2014 European Search Report issued in European Patent Application No. 12 19 7402.
Apr. 24, 2014 European Search Report issued in European Patent Application No. 13 19 5848.
Oct. 25, 2013 European Search Report issued in European Patent Application No. 13 15 8531.
Broughton et al., U.S. Appl. No. 14/100,745, filed Dec. 9, 2013.
Fitt et al., Pending U.S. Appl. No. 13/792,851, filed Mar. 11, 2013.
Aug. 5, 2013 Search Report issued in British Patent Application No. 1308033.8.
Broughton et al., Pending U.S. Appl. No. 14/100,745, filed Dec. 9, 2013.
Mar. 11, 2015 Office Action issued in U.S. Appl. No. 13/716,300.
Nov. 10, 2014 Office Action issued in U.S. Appl. No. 13/716,300.
Nov. 20, 2014 Office Action issued in U.S. Appl. No. 13/716,648.
Apr. 6, 2015 Office Action issued in U.S. Appl. No. 13/716,648.
Jun. 5, 2015 Office Action issued in U.S. Appl. No. 13/716,708.
Jun. 12, 2015 Office Action in U.S. Appl. No. 13/716,254.
Jun. 19, 2015 Office Action issued in U.S. Appl. No. 13/716,244.
Nellis and Klein, "Heat Transfer", 2009, Cambridge University, pp. 748-751.
Jul. 28, 2015 Office Action issued in U.S. Appl. No. 13/716,796.
Jul. 29, 2015 Office Action issued in U.S. Appl. No. 13/716,648.
Aug. 13, 2015 Office Action issued in U.S. Appl. No. 13/716,516.
Aug. 14, 2015 Office Action issued in U.S. Appl. No. 13/716,239.
Aug. 27, 2015 Office Action issued in U.S. Appl. No. 13/792,851.
Sep. 4, 2015 Office Action issued in U.S. Appl. No. 13/716,503.
Oct. 7, 2015 Office Action issued in U.S. Appl. No. 13/716,587.
Dec. 1, 2015 Office Action issued in U.S. Appl. No. 13/716,808.
Oct. 29, 2015 Office Action issued in Chinese Application No. 201210599254.0.
Feb. 16, 2016 Office Action issued in U.S. Appl. No. 13/716,503.
Aug. 11, 2016 Office Action Issued in U.S. Appl. No. 13/716,808.
Jun. 10, 2016 Office Action Issued in U.S. Appl. No. 13/716,503.
Apr. 22, 2016 Office Action issued in U.S. Appl. No. 14/100,745.

(56) References Cited

OTHER PUBLICATIONS

Apr. 22, 2016 Office Action issued in U.S. Appl. No. 13/716,808.
Apr. 7, 2016 Office Action issued in U.S. Appl. No. 13/716,587.
Translation of Oct. 12, 2016 Office Action issued in Russian Patent Application No. 2012154565.
Jan. 20, 2017 Office Action issued in U.S. Appl. No. 13/716,808.
Feb. 2, 2017 Office Action issued in U.S. Appl. No. 13/716,587.
Apr. 10, 2017 Search Report issued in European Patent Application No. 12197394.
Sep. 15, 2016 Office Action issued in U.S. Appl. No. 13/716,587.
Oct. 28, 2016 Office Action Issued in U.S. Appl. No. 14/100,745.
Dec. 2, 2016 Office Action Issued in U.S. Appl. No. 13/716,503.
Sep. 8, 2017 Search Report issued in European Patent Application No. 12197391.

* cited by examiner

ELECTRICAL HARNESS

CROSS-REFERENCE TO RELATED APPLICATIONS

This application is based upon and claims the benefit of priority from British Patent Application Number GB1122140.5 filed 22 Dec. 2011, the entire contents of which are incorporated by reference.

BACKGROUND OF THE INVENTION

1. Field of the Invention

This invention relates to a network for distributing signals and power around a gas turbine engine using an electrical harness. In particular, aspects of this invention relate to embedding electrical conductors into a rigid harness for use in distributing electricity around a gas turbine engine.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, are commonly transmitted along conductors. Conventionally, such conductors may be in the form of wires and/or cables which are assembled together in a harness. In such a conventional harness, each wire may be surrounded by an insulating sleeve, which may be braided or have a braided cover. The connections between the individual components and the conventional harness are made, for example, by multi-pin plug and socket connectors. Similarly, communication between the harness and power, control and signalling circuitry is achieved through a multi-pin connector.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 therefore comprises a multitude of insulated wires and cables. This makes the conventional harness bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated.

OBJECTS AND SUMMARY OF THE INVENTION

According to the present invention, there is provided a gas turbine engine installation comprising an electrical system (which may be referred to in general as an electrical harness) arranged to transfer electrical signals around the engine installation. The electrical system (or harness) comprises an electrical harness raft, which comprises electrical conductors embedded in a rigid material.

According to an aspect of the invention, the gas turbine installation comprises such an electrical harness raft comprising multiple (or more than one) electrical conductors embedded in a rigid material. The electrical harness raft may be at least a part of a first engine installation component. The gas turbine engine installation also comprises a second engine installation component which comprises electrical conductors. At least one flexible cable is connected between the electrical harness raft and the second engine installation component so as to electrically connect electrical conductors of the electrical harness raft with electrical conductors of the second engine installation component.

According to a further aspect of the invention, there is provided a method of assembling a gas turbine engine installation. The method comprises installing an electrical harness raft having multiple electrical conductors arranged to transfer electrical signals around the engine embedded in a rigid material. The method comprises connecting a flexible cable between the electrical harness raft and another (second) engine installation component comprising electrical conductors so as to electrically connect electrical conductors of the electrical harness raft with electrical conductors of the other engine installation component.

Aspects of the invention described herein may apply to the method of assembly of a gas turbine engine (or gas turbine engine installation) as well as to the apparatus (for example the gas turbine engine installation).

The gas turbine engine installation (which may simply be a gas turbine engine) may comprise any number of electrical harness rafts. Any one or more rafts may be connected together and/or to other components using flexible cables. For example, one electrical harness raft may be directly electrically connected (for example using a flexible cable) to one, two, three, four, five, six, seven, eight, nine, ten or more than ten other components, such as other electrical harness rafts.

It will be appreciated that the electrical signals transferred around the engine using the electrical harness rafts may take any form. For example, the electrical signals may include, by way of non-limitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in. In other words, an electrical harness raft may be used to transfer/communicate any possible combination of electrical signals in any part of a gas turbine engine installation or a related (for example electrically and/or mechanically connected) structure/component/system.

The electrical conductors embedded in the rigid material may be used to transfer electrical signals around a gas turbine engine. Embedding electrical conductors in a rigid material (to create an electrical harness raft) has a great number of advantages over transferring electrical signals using a conventional harness, at least some of which are discussed herein.

The electrical harness rafts may provide greater protection to the electrical conductors than a conventional harness. For example, the rigid and/or hard material (which may be a rigid and/or hard composite material) in which the conductors are embedded may provide greater protection (for example greater mechanical protection) to the embedded conductors, for example due to being resistant to breaking and/or snapping and/or piercing and/or puncturing. Purely by way of example, the use of electrical harness rafts may reduce, or substantially eliminate, the chance of foreign bodies coming into contact with the electrical conductors, for example through fluid ingress. The electrical harness raft(s) may provide improved protection to the electrical conductors during manufacture/assembly of the raft/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

Use of one or more electrical harness rafts may significantly reduce build time of an engine. For example, use of electrical harness rafts may significantly reduce the part count involved in engine assembly compared with a conventional harness arrangement. The number and/or complexity of the operations required to assemble an engine (for example to assemble/install the electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical harness rafts, which themselves may be straightforward to handle, position, secure and connect. Connection between the rafts and other electrical components using the flexible cable(s) may be particularly convenient and straightforward. Thus, use of electrical harness rafts in a gas turbine installation may reduce assembly time and/or reduce the possibility of errors occurring during assembly.

Use of electrical harness rafts may provide significant advantages during maintenance, such as repair and overhaul. As discussed above, the electrical harness rafts may be particularly quick and straightforward to assemble. The same advantages discussed above in relation to assembly apply to disassembly/removal from the gas turbine engine. Thus, any repair/overhaul that requires removal of at least a part of the electrical harness may be simplified and/or speeded up through use of electrical harness rafts, for example compared with conventional harnesses. Use of electrical harness rafts may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the relevant electrical harness raft, for example by simply disconnecting it from the engine and any other electrical harness rafts/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical harness rafts prior to engine assembly. This may allow the electrical and/or mechanical operation of the electrical harness rafts to be proven before installation, thereby reducing/eliminating the testing required during engine installation.

The electrical harness rafts may be a particularly lightweight solution for transferring electrical signals around an engine. For example, an electrical harness raft may be lighter, for example significantly lighter, than a conventional harness required to transmit a given number of electrical signals. A plurality of conductors may be embedded in a single electrical harness raft, whereas in a conventional arrangement a large number of heavy, bulky wires and/or insulating sleeves would be required. The reduced weight may be particularly advantageous, for example, when used on gas turbine engines on aircraft.

Electrical harness rafts may be more easily packaged and/or more compact, for example than conventional harnesses. Indeed, the electrical harness rafts can be made into a very wide range of shapes as desired. This may be achieved, for example, by manufacturing the electrical harness rafts using a mould conforming to the desired shape. As such, each electrical harness raft may be shaped, for example, to turn through a tighter corner (or smaller bend radius) than a conventional harness. The electrical harness rafts may thus provide a particularly compact solution for transferring electrical signals around a gas turbine engine. The electrical harness rafts may be readily shaped to conform to neighbouring components/regions of a gas turbine engine, for example components/regions to which the particular electrical harness raft is attached.

The environment of a gas turbine engine during operation may be particularly severe, with, for example, high levels of vibration and/or differential expansion between components as the temperature changes through operation and as the components move relative to each other. Providing at least one flexible cable to connect an electrical harness raft to another component may allow the electrical harness rafts and/or components to accommodate vibration and/or relative movement, for example of the component(s)/assemblies to which they are attached/mounted during use. For example, the flexible cable(s) used to electrically connect electrical harness raft(s) to other component(s) may have sufficient length to accommodate such vibration and/or movement during use.

For example, providing separate (for example more than one) electrical harness rafts and connecting at least some (for example at least two) of them together using at least one flexible cable may allow the electrical harness rafts to accommodate vibration and/or relative movement of the component(s)/assemblies to which they are attached/mounted during use.

The rigid material may be any suitable material, such as a rigid composite material. The rigid composite material may comprise any suitable combination of resin and fibre as desired for a particular application. For example, any of the resins and/or fibres described herein may be used to produce a rigid composite material for the electrical harness raft.

The second engine installation component may be any suitable component, for example a further electrical harness raft comprising (multiple) electrical conductors embedded in a rigid material. Thus, more than one electrical harness raft may be provided in the engine installation. At least two electrical harness rafts may be electrically connected together using a flexible cable.

The second engine component may be an electronic control unit. Examples of electronic control units (ECUs) that could form at least a part of the second engine component include Electronic Engine Controllers (EECs) and Engine Health Monitoring Units (EMUs). Thus electrical conductors in the ECUs may be connected to electrical conductors of the electrical harness raft, for example via the flexible connecting cable.

The electrical harness raft may be provided in any suitable location/position of the gas turbine engine installation. For example, the gas turbine engine may comprise a bypass flow duct formed between an engine core and an engine fan casing (the gas turbine engine may be a turbofan engine, for example); and the electrical harness raft may form at least a part of a radially extending splitter (which may be referred to as a bifurcation) that extends across the bypass flow duct. In this way, an electrical harness raft (which may be referred to as a splitter electrical harness raft) may provide an electrical connection between a fan casing and an engine core.

The splitter electrical harness raft may be electrically connected to other components (for example to one or more other electrical harness rafts) using the flexible cable. Alternatively or additionally, a splitter electrical harness raft may be electrically connected to one or more other electrical harness rafts directly, for example using connectors embedded in the respective rafts.

Any of the features described herein in relation to any electrical harness raft (including components/systems attached thereto/mounted thereon) may apply to a splitter electrical harness raft. For example, the splitter electrical harness raft may be provided with appropriate connectors, which may be used to connect to a corresponding connector, for example provided on the flexible connecting cable and/or on other components to which the splitter electrical harness raft may be provided. By way of further example, the splitter electrical harness raft may be provided with (for example have mounted thereon) components and/or other systems, such as pipes of fluid systems. Such systems/components may need to pass between the engine core and the fan case, for example fluid systems, such as fuel/oil/hydraulic/pneumatic/cooling air/sealing air systems.

The splitter electrical harness raft may be located, or embedded, inside a surrounding splitter (or bifurcation) structure. Other components may also be mounted inside such a surrounding splitter structure, for example a drive shaft in the case that the case turbine engine has a fan mounted accessory gearbox to which power/drive must be supplied.

At least some of the advantages of using the electrical harness rafts (for example as described herein) may be particularly applicable to a splitter electrical harness raft. For example, at least a part of the splitter electrical harness raft crosses the bypass flow between the engine core and the fan case. Thus, any external surfaces (which may be formed by the splitter electrical harness raft itself or by a surrounding splitter structure) are of particular importance because they are gas-washed by the propulsive bypass flow. Because the electrical harness raft is much smaller than a conventional harness for a given number of electrical conductors, the size of the splitter may be reduced, and thus the detrimental impact on the bypass flow may be reduced, thereby improving (i.e. reducing) specific fuel consumption.

In order for electrical conductors to change from travelling around the fan case to go through a splitter, they need to change direction through approximately 90 degrees (for example to go from a circumferential/axial direction to a radial direction). As mentioned herein, conventional electrical harness are bulky and have large minimum bend radii. Thus, a significant amount of space (and material, which contributes to weight) is required in order to effect such a direction change. However, use of a splitter electrical harness raft alleviates/eliminates this problem, because the large bend radii are not required. For example, the splitter raft itself could be manufactured to have a low radius, compact, direction change at one (or both ends), such that the electrical connectors embedded therein become substantially aligned with those of another raft (which may, for example, run circumferentially around the engine). Alternatively or additionally, the splitter raft (and/or raft to which it is to be connected) may have connectors embedded therein at an angle suitable to accommodate a direction change of the electrical conductors.

A further advantage of using a splitter electrical harness raft is that it may facilitate separation of the engine core from the engine fan case. In order to achieve such separation, the splitter electrical harness raft may simply need to be detached from its connections with other components (such as other rafts) and removed. This may be a lot more straightforward than disconnecting and detaching the multitude of conductors/wires of a conventional harness.

At least one of the electrical conductors embedded in the electrical harness raft may be an electrically conductive wire. The or each electrically conductive wire may be surrounded by an electrically insulating sleeve. As such, individual wires may be laid into (or embedded in) the electrical harness raft, and each wire may be used to transfer one or more electrical signals through the raft and around the engine. Providing a sleeve to the individual wires may provide extra mechanical and/or electrical protection/isolation.

At least some (for example a plurality) of the electrical conductors may be provided in a flexible printed circuit. Thus, at least some of the electrical conductors may be provided as electrically conductive tracks in a flexible substrate. The flexible printed circuit may be flexible before being embedded in the rigid material.

Providing the electrical conductors as tracks in a flexible printed circuit may allow the size of the resulting electrical harness raft to be reduced further and/or substantially minimized. For example, many different electrical conductors may be laid into a flexible printed circuit in close proximity, thereby providing a compact structure. The flexible substrate of a single flexible printed circuit may provide electrical and/or mechanical protection/isolation to a large number of electrical conductors.

Any given electrical harness raft may be provided with one or more electrical wires embedded therein (which may be sheathed) and/or one or more flexible printed circuits embedded therein. As such, a given electrical harness raft may have wires and flexible printed circuits laid therein.

It will be appreciated that the embedded electrical conductors (whether they are provided as embedded electrical wires or as conductive tracks in a flexible printed circuit embedded in the rigid material) may be described as being fixed in position by the rigid material, for example relative to the rest of the electrical harness raft. It will also be appreciated that the embedded electrical conductors may be said to be surrounded by the rigid material and/or buried in the rigid material and/or integral with (or integrated into) the rigid material.

The or each flexible cable (connected between the first electrical harness raft and the second engine installation component) may comprise a flexible printed circuit having electrically conductive tracks in a substrate. The or each flexible cable (connected between the first electrical harness raft and the second electrical harness raft) may comprise an electrically insulated conductive wire. Any combination of wires and flexible printed circuits may be used to electrically connect two electrical harness rafts together.

At least one electrical harness raft may have embedded therein (or may be provided with) at least one electrical connector (or socket). The or each electrical connector may be in electrical contact with at least one of the respective electrical conductors embedded in the rigid material and may have terminals for connection with a complimentary connector.

Providing electrical harnesses with integral electrical sockets/electrical connectors (for example by embedding them in the raft, for example to secure them in place relative to the raft) may provide a particularly quick, efficient and reliable means to connect (for example electrically connect) components to the electrical harness rafts and/or to connect electrical harness rafts together (either directly or indirectly).

The or each flexible cable (connected between the first electrical harness raft and the second electrical harness raft) may comprise complimentary connectors that are connected to corresponding electrical connectors embedded in the electrical harness raft(s). In this way, assembly of the electrical harness raft to other components (including to each other) may be facilitated. For example, it may be possible to connect an electrical harness raft to another component (such as another electrical harness raft) simply by connecting one set of (or in some cases more than one set of, such as two, three, four, five or more than five) complimentary connectors/sockets together at each raft.

Some electrical harness rafts may be provided with electrical connectors that are complimentary to electrical connectors provided with other components, such as other electrical harness rafts. This may allow some electrical harness rafts to be electrically connected to other components directly, using the complimentary sockets embedded therein, rather than (or in addition to) using flexible cables. This may be appropriate in regions of the engine in which it is not necessary to have a flexible cable connecting two rafts together.

One or more electrical harness raft may be mechanically and/or electrically connected to other components/systems of the gas turbine engine, for example ancillary, auxiliary or control components. Such other components/systems may be provided to an electrical harness raft in any suitable manner. For example, such other components/systems may be mounted on one or more electrical harness rafts. Thus, a surface of an electrical harness may be used as a mounting surface for other gas turbine engine components/systems, such as ancillary/auxiliary components/systems.

At least one electrical harness raft may have an electronic control unit (ECU) mounted thereon. Such an electronic control unit may be an electronic engine controller (EEC). The electrical harness raft may provide a convenient surface on which to mechanically mount such an ECU/EEC. The electrical harness raft may be provided with (for example have embedded therein) an electrical connector/socket that can be connected to a corresponding (or complimentary) connector on an ECU/EEC which may be physically mounted on the raft. Thus, the electrical harness raft may provide a convenient, compact, and lightweight solution for mounting and/or connecting ECUs/EECs to the engine, and/or for electrically connecting the EEC/ECU to one or more of the electrical conductors in the electrical harness raft on which it is mounted Thus, through the use of suitable complimentary (or corresponding) connectors provided to the ECU (or EEC) and the corresponding electrical harness raft, the ECU/EEC may be electrically connected to one or more of the electrical conductors in the electrical harness raft on which it is mounted in a particularly convenient, compact, and lightweight manner.

At least one electrical harness raft may be provided with at least one mount on which components (for example auxiliary/ancillary components/systems) of the gas turbine engine are (or may be) mounted. The mount may be a bracket, for example a bespoke bracket for the component/system mounted thereon or a conventional/standard bracket. The electrical harness raft may provide a stable, regular and convenient platform on which to mount the various systems/components. The combination of the installed electrical harness raft with components/systems mounted thereon may be much more compact and/or straightforward to assemble and/or have a greatly reduced number of component parts, for example compared with the corresponding conventional electrical harness and separately mounted components/systems.

The mounts may be used to attach any component/system to an electrical harness raft (and thus to the engine) as required. For example, fluid pipes for transferring fluid around the engine may be mounted to the electrical harness rafts (for example mechanically mounted using a bracket), and thus to the engine. The fluid pipes may be arranged to carry any fluid as desired, including gas (such as cooling air, sealing air, and/or muscle air (for example for pneumatic systems)) and/or liquid (such as fuel, water, oil and/or hydraulic fluid). Of course, more than one set of fluid pipes, for example for carrying different or the same fluids, may be mounted on the same electrical harness raft.

Examples of other components/systems that may be at least in part mounted to an electrical harness raft include, by way of non-limitative example: fire detectors and/or fire detection elements; thermocouples for measuring air temperature (for example within a particular engine zone); vibration monitoring processing equipment (for example a signal processing component/box containing electronics used to process a vibration signal that may be measured elsewhere in the engine); equipment for measuring fluid quality (for example a probe for oil debris monitoring may be provided to one or more pipes mounted to the raft, and/or a signal processing box for processing the oil quality measurements may be mounted on the box); and pressure sensors and/or signal processing equipment, for example for fluid pipes mounted on the rafts.

An engine installation according to the present invention may comprise raft assemblies that do not have electrical conductors embedded therein. Such raft assemblies may provide one or more mounting surfaces for engine components/systems, such as (by way of non-limitative example) any one or more of the components/systems disclosed herein as being optionally mounted on an electrical harness raft. For example, an embodiment may have at least one electrical harness raft, together with at least one raft assembly that does not have electrical conductors embedded therein. Components/systems may be mounted to and/or extend between an electrical harness raft and a raft assembly that does not have electrical conductors embedded therein.

At least one electrical harness raft (for example some or all of the electrical harness rafts where more than one electrical harness raft is provided) may be connected/attached/mounted to the gas turbine engine using at least one anti-vibration mount. Using an anti-vibration mount to attach the electrical harness raft to the gas turbine engine may reduce (or substantially eliminate) the amount (for example the amplitude and/or the number/range of frequencies) of vibration being passed to the electrical harness raft from the gas turbine engine, for example during use. This may help to prolong the life of the electrical harness raft. Furthermore, any other components that may be attached to the electrical harness raft (as discussed above and elsewhere herein) may also benefit from being mounted to the gas turbine engine via the anti-vibration mounts, through being mounted on the electrical harness raft. This may mean that any components that would conventionally be mounted directly to the gas turbine engine and require at least a degree of vibration isolation no longer require their own dedicated anti-vibration mount. Such components may include, for example, Electronic Engine Controllers (EECs) and Engine Health Monitoring Units (EMUs). Thus, the total number of anti-vibration mounts that are required to assemble an engine may be reduced. This may reduce the number of parts required and the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to an electrical harness raft, may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

According to an aspect of the invention, there is provided a fan casing for a gas turbine engine (for example a high bypass ratio gas turbine engine) provided with an electrical harness raft, which comprises electrical conductors for transferring electrical signals around a gas turbine engine embedded in a rigid material. One or more electrical harness rafts may be attached to the fan casing (for example using anti-vibration mounts, as described above and elsewhere herein). Electrical harness rafts may be connected together and/or to other components of the gas turbine engine using at least one flexible cable to electrically connect electrical conductors of the components together. The electrical harness raft(s) and/or the connecting flexible cables may comprise or be provided with any of the features described herein, for example in relation to a gas turbine engine installation.

One or more of the electrical harness rafts may be shaped to correspond to a portion of an outer surface of the fan casing to which they are mounted. In this case, the fan casing may be said to be at least partially surrounded by electrical harness rafts. Conforming the electrical harness rafts to the shape of the fan casing (for example to the shape of the outer surface of the fan casing) may be a particularly compact solution for providing electrical signals around the gas turbine engine, for example around at least a part of the circumference of the gas turbine engine.

BRIEF DESCRIPTION OF THE DRAWINGS

The invention will now be described, by way of example only, with reference to the accompanying Figures, in which.

DETAILED DESCRIPTION OF THE PREFERRED EMBODIMENTS

Figure 1:
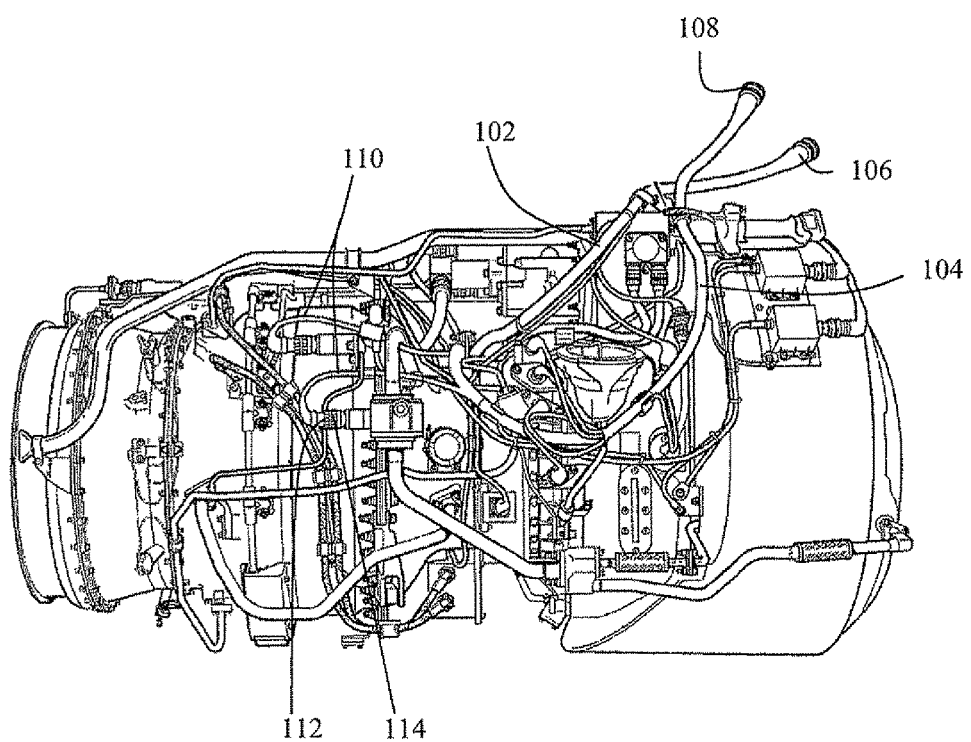
FIG. 1 shows a gas turbine engine with a conventional harness.
Figure 2:
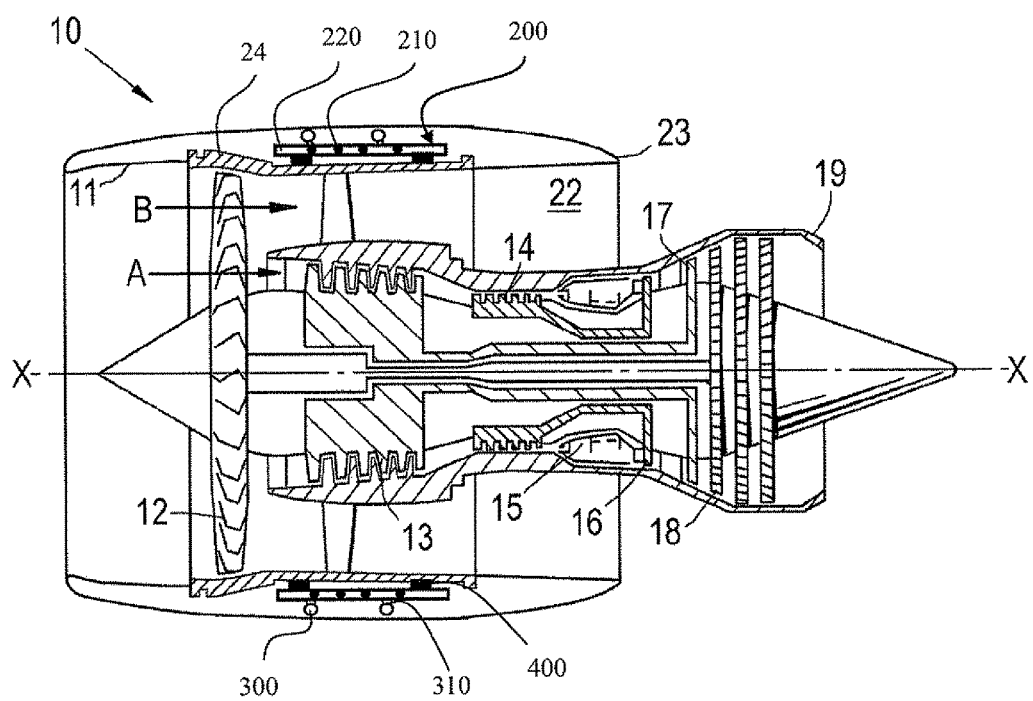
FIG. 2 shows a cross-section through a gas turbine engine having an electrical harness raft in accordance with the present invention.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 may be at least a part of a gas turbine engine or gas turbine engine installation according to the present invention. The gas turbine engine 10 comprises at least one electrical harness raft 200 for transmitting/transferring electrical signals (or electricity, including electrical power and/or electrical control signals) around the engine and/or to/from the engine 10 from other components, such as components of an airframe. The function and/or construction of the electrical harness raft 200, and the electrical/mechanical connections between different electrical harness rafts 200, and between electrical harness rafts 200 and other components/systems, may be as described above and elsewhere herein.

In FIG. 2, the electrical harness raft 200 (which may be referred to herein simply as a raft 200) comprises at least one electrical conductor 210 embedded in a rigid composite material 220. In the FIG. 2 embodiment, the electrical harness raft 200 is provided with a further gas turbine system in the form of fluid pipes or conduits 300 (which may, for example carry liquid and/or gas). The fluid pipes 300 are attached to the raft 200 using mounting brackets 310. Alternatively or additionally, the electrical harness raft(s) 200 may be provided with (for example by having mounted thereon or thereto) other systems and/or components relating to the gas turbine engine 10. Some rafts 200, on the other hand, may not have any additional components and/or systems mounted thereon.

The raft 200 (and any components/systems 300 with which it is provided) is connected to (for example mounted on) the gas turbine engine 10 using a mount 400. In FIG. 2, the raft 200 is connected to a fan casing 24 of the gas turbine engine 10 using the mount 400. The raft 200 may thus be radially outward of the fan casing 24, between the fan casing 24 and the outer surface (or nacelle) of the assembled engine 10. The raft 200 (or other rafts 200) may, however, be connected to other parts of the gas turbine engine 10. The mount 400 may be any suitable mount. By way of example, the mount 400 may be an anti-vibration (or AV) mount configured to reduce or substantially eliminate vibration from components of the gas turbine engine 10 being passed to the raft 200, and thus to any components/systems 300 mounted thereon/connected thereto.

The electrical harness rafts 200 comprise electrical conductors 210 provided in a rigid material. Any rigid material may be suitable, such as a rigid composite material 220. It will be appreciated that any suitable method may be used to construct the electrical harness raft(s) 200.

Figure 3:
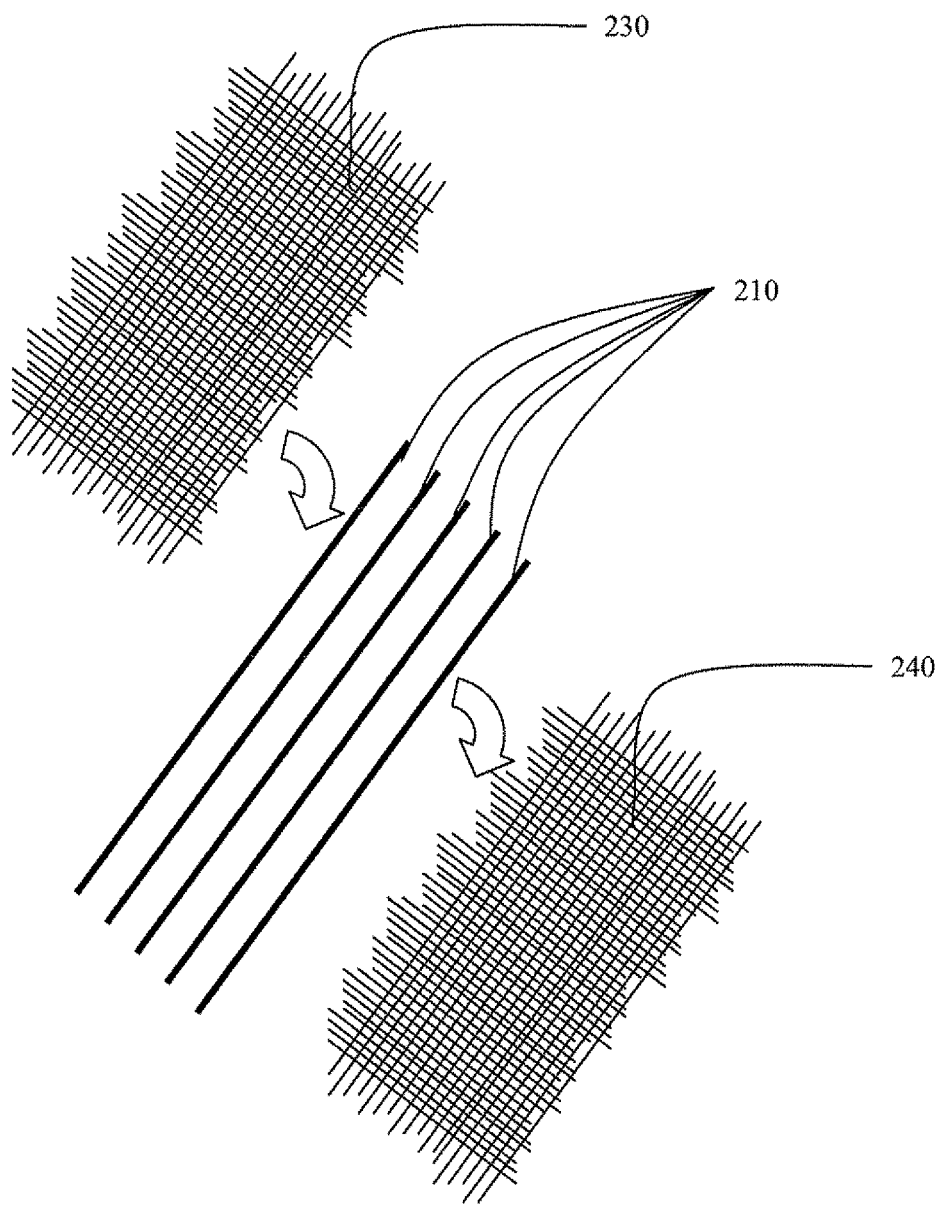
FIG. 3 shows a schematic of an electrical harness raft prior to assembly.

FIG. 3 shows components of an example of an electrical harness raft 200 prior to one method of construction. The electrical conductors 210 are provided between two layers of material 230, 240 that, after construction, form the rigid material 220. The material 230, 240 may be a fibre and resin compound. Such a fibre and resin compound may, after suitable treatment (for example heat treatment) produce a rigid composite material 220, for example an organic matrix composite material 220. In the example of FIG. 3, the fibre and resin compound is formed of a sheet of interwoven fibres, or strands. The strands in FIG. 3 extend in perpendicular directions, although the strands may extend in any one or more directions as required. The strands/fibres may be pre-impregnated (or "pre-pregged") with the resin.

Any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon).

Any suitable material may be used for the rigid material 220. For example, the rigid material 220 need not be a fibre/resin, or a composite, material. For example, the electrical conductors 210 may be embedded in any one or more of the following materials: epoxy, BMI (bismaleimide), PEEK (polyetheretherketone), PTFE (polytetraflouroethylene), PAEK (polyaryletherketone), polyurethane, and/or polyamides (such as nylon). Thus, fibres may or may not be included in such materials that may form the rigid material 220. Where fibres are not included in the rigid material 220, a suitable alternative manufacturing process may be used.

The electrical conductors 210 (which may, as described in more detail elsewhere herein, be of any form, such as conductive wires, insulated conductive wires, and/or printed flexible circuits such as those described herein in relation to FIGS. 8 to 11) may be placed in any desired arrangement between the first and second layers 230, 240. Prior to any treatment, both the first and second layers 230, 240 and the electrical conductors 210 may be flexible, for example supple, pliable or malleable.

As such, when the layers 230, 240 and the electrical conductors 210 are placed together, they may be moulded, or formed, into any desired shape. For example, the layers 230, 240 and the electrical conductors 210 may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final raft to adopt shapes that are curved in two-dimensions or three-dimensions.

In order to produce the rigid raft 200 from the material layers 230, 240 and the electrical conductors 210, the assembly (which may be in a suitably shaped mould, as described above) may be subject to a suitable hardening, stiffening, and/or setting treatment. Such a treatment may involve raising the temperature (i.e. heat treatment) and/or applying increased pressure. The treatment may be conducted in, for example, an autoclave. In this way, the electrical conductors 210 may be said to be sandwiched between the upper and lower material layers 230, 240.

Any suitable method could be used to produce the rigid raft 200. For example, the strands/fibres need not be pre-impregnated with the resin. Instead, the fibres/strands could be put into position (for example relative to the electrical conductors) in a dry state, and then the resin could be fed (or pumped) into the mould. Such a process may be referred to as a resin transfer method.

After the treatment, the rigid electrical harness raft 200 may be set in the desired shape. Suitable electrical connectors and/or sockets may be fitted to the raft 200. Such connectors may be fitted prior to stiffening treatment of the material layers 230, 240 and the electrical conductors 210, or after such treatment. The connectors may be in electrical connection with the conductors 210 and may have pins or connectors for connection (electrical and/or mechanical) to other components of the gas turbine engine 10 (including the flexible connection cables and other electrical harness rafts), as discussed in greater detail elsewhere herein.

Figure 4:
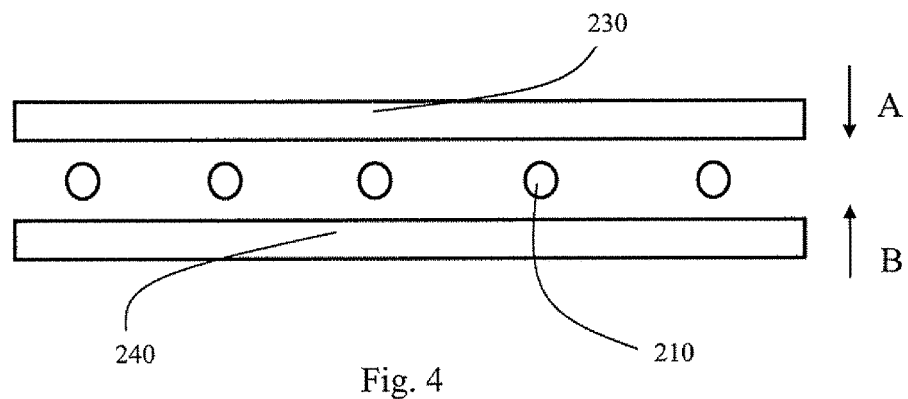
FIG. 4 shows a schematic of a cross-section through an electrical harness raft prior to assembly.

FIG. 4 shows an example of a cross-section through upper and lower material layers 230, 240 and electrical conductors 210 prior to being placed together (by moving the upper layer 230 in the direction of arrow A and the lower layer 240 in the direction of arrow B) and treated to produce the electrical harness raft 200. The upper and lower layers 230, 240 in the example shown in FIG. 4 (and FIG. 6, discussed below) may comprise at least one layer, for example multiple layers, of fibre and/or fibre and resin compound.

Figure 5:
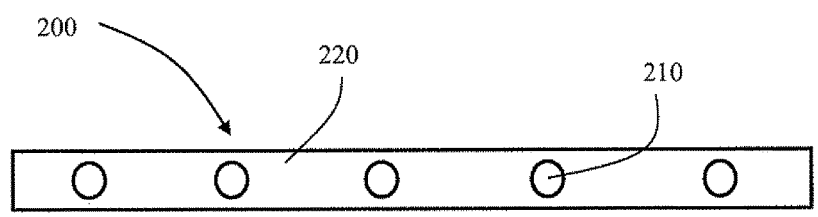
FIG. 5 shows a schematic of a cross-section through the electrical harness raft of FIG. 4 after assembly.

FIG. 5 shows a cross-section through the electrical harness raft 200 produced by the FIG. 4 arrangement, for example after stiffening treatment. The FIG. 5 raft 200 has five individual electrical conductors 210, but the electrical harness raft 200 could have any number of electrical conductors 210 embedded therein, for example fewer than 5, at least 5, at least 10, at least 50, at least 100.

Figure 6:
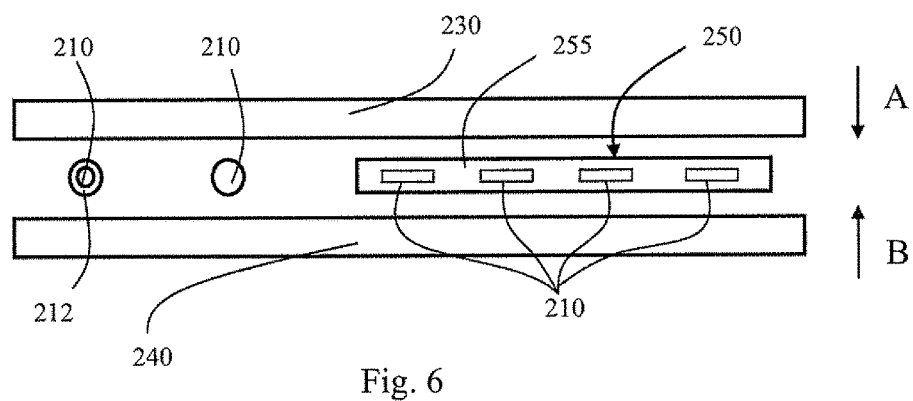
FIG. 6 shows a schematic of a cross-section through an electrical harness raft prior to assembly.
Figure 7:
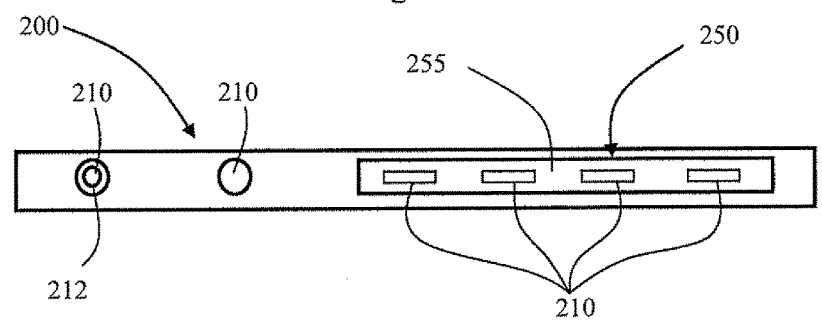
FIG. 7 shows a schematic of a cross-section through the electrical harness raft of FIG. 6 after assembly.

FIG. 6 shows an example of a cross-section through an alternative arrangement of conductors between the upper and lower material layers 230, 240 prior to being placed together, moulded, and stiffened to produce an electrical harness raft 200. FIG. 7 shows a cross-section through the electrical harness raft 200 produced by the FIG. 6 arrangement, for example after stiffening treatment.

In the FIGS. 6 and 7 arrangement, the electrical conductors 210 take a variety of different forms and/or are provided in a variety of different ways. The conductor 210 on the left hand side of FIGS. 6 and 7 is provided with a sheath, or coating, or sleeve 212. The sleeve 212 may provide protection to the conductor 210 and/or electrical insulation. The conductor 210 second from the left in FIGS. 6 and 7 is unprotected. Thus, the conductor 210 second from the left in FIGS. 6 and 7 may be, for example, a conductive (for example metal, for example copper) wire laid directly into the rigid composite material 220.

The other conductors 210 in the example shown in FIGS. 6 and 7 may be provided as part of (or in) a flexible printed circuit (FPC) 250, which may be referred to as a flexible printed circuit board (or FPCB) 250. The FPC 250 comprises conductors 210, which may be in the form of conductive tracks, laid into a flexible substrate 255. The flexible printed circuit 250 itself may be flexible. It will be appreciated that the electrical harness raft 200 may comprise any number of any one or more of the sleeved 212 or un-sleeved conductors 210 or flexible printed circuits 250.

As discussed in greater detail below, for example in relation to FIGS. 12, 13, and 14, flexible printed circuits may additionally or alternatively be used to connect two or more electrical harness rafts 200 together. The basic structure of flexible printed circuits 250 used to connect rafts 200 together and to be embedded in the rafts 200 themselves may be substantially the same, as discussed below in relation to FIGS. 8 to 11. Thus, the description of a flexible printed circuit (or flexible printed circuit board) 250 below in relation to FIGS. 8 to 11 may apply to flexible printed circuits used as flexible cables to connect rafts 200 together, or to flexible printed circuits laid into the rafts 200.

Figure 8:
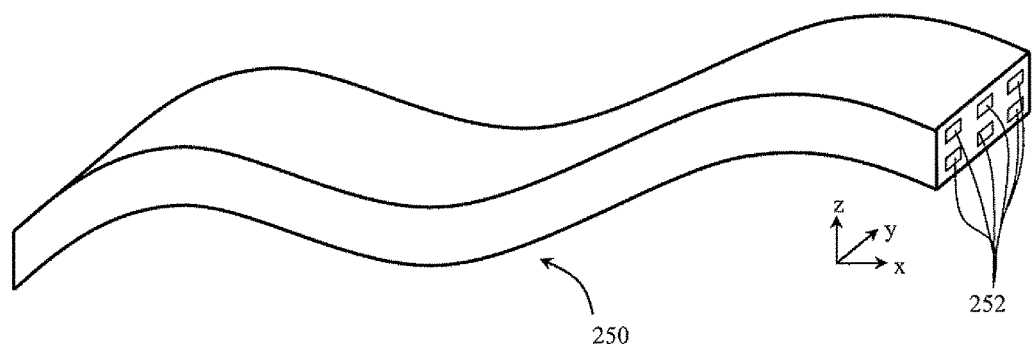
FIG. 8 shows a perspective view of a flexible printed circuit.
Figure 9:
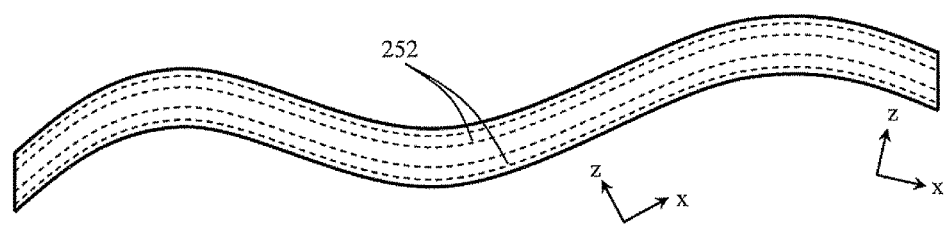
FIG. 9 shows a side view of the flexible printed circuit of FIG. 8.
Figure 10:
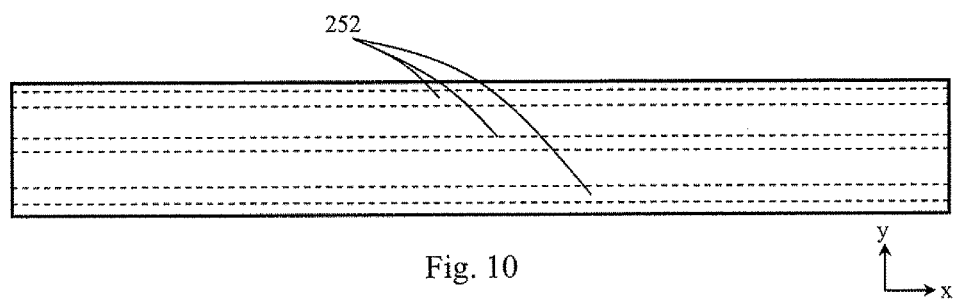
FIG. 10 shows a top view of the flexible printed circuit of FIG. 8.
Figure 11:
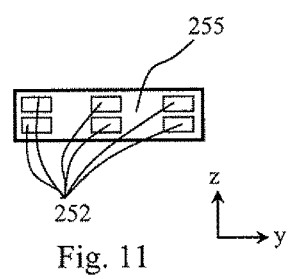
FIG. 11 shows a cross-sectional view of the flexible printed circuit of FIG. 8.

FIG. 8 shows a perspective view of a portion of a flexible printed circuit (FPC) 250, and FIGS. 9, 10, and 11 show side, top, and cross-sectional views respectively.

Such an FPC 250 may comprise a flexible (for example elastically deformable) substrate 255 with conductive tracks 252 laid/formed therein. The FPC 250 may thus be deformable. The FPC may be described as a thin, elongate member and/or a sheet-like member. Such a thin, elongate member may have a major surface defined by a length and a width, and a thickness normal to the major surface. In the example shown in FIGS. 8 to 11, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 9. The x-y surface(s) (ie the surfaces formed by the x and y directions) may be said to be the major surface(s) of the FPC 250. In the example shown in FIGS. 8 to 11, the FPC is deformable in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used.

The conductive tracks 252, which may be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the electrical harness raft(s) 200, for example around a gas turbine engine 10 and/or to/from components of a gas turbine engine and/or an airframe attached to a gas turbine engine.

The conductive tracks 252 shown in FIGS. 8 to 11 may be equivalent to the conductive tracks 210 shown in the FPC 250 laid in the raft 200 of FIG. 7. Additionally or alternatively, the conductive tracks 252 shown in the FPC of FIGS. 8 to 11 may be used to transfer electrical signals between electrical harness rafts 200, for example by using the FPC 250 as a flexible cable to connect two or more rafts 200 together.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

The example shown in FIGS. 8 to 11 has 6 conductive tracks 252 running through the substrate 255. However, the number of conductive tracks 252 running through a substrate 255 could be fewer than 6, or greater than 6. Indeed the number of conductive tracks 252 could be far greater than 6, for example tens or hundreds of tracks, as required. As such, many electrical signals and/or power transmission lines may be incorporated into a single FPC 250.

A single FPC 250 may comprise one layer of tracks, or more than one layer of tracks, for example, 2, 3, 4, 5, 6, 7, 8, 9, 10 or more than 10 layers of tracks. An FPC may comprise significantly more than 10 layers of tracks, for example at least an order of magnitude more layers of tracks. In this regard, a layer of tracks may be defined as being a series of tracks that extend in the same x-y surface. Thus, the example shown in FIGS. 8 to 11 comprises 2 layers of tracks, with each layer comprising 3 tracks 252.

Figure 12:
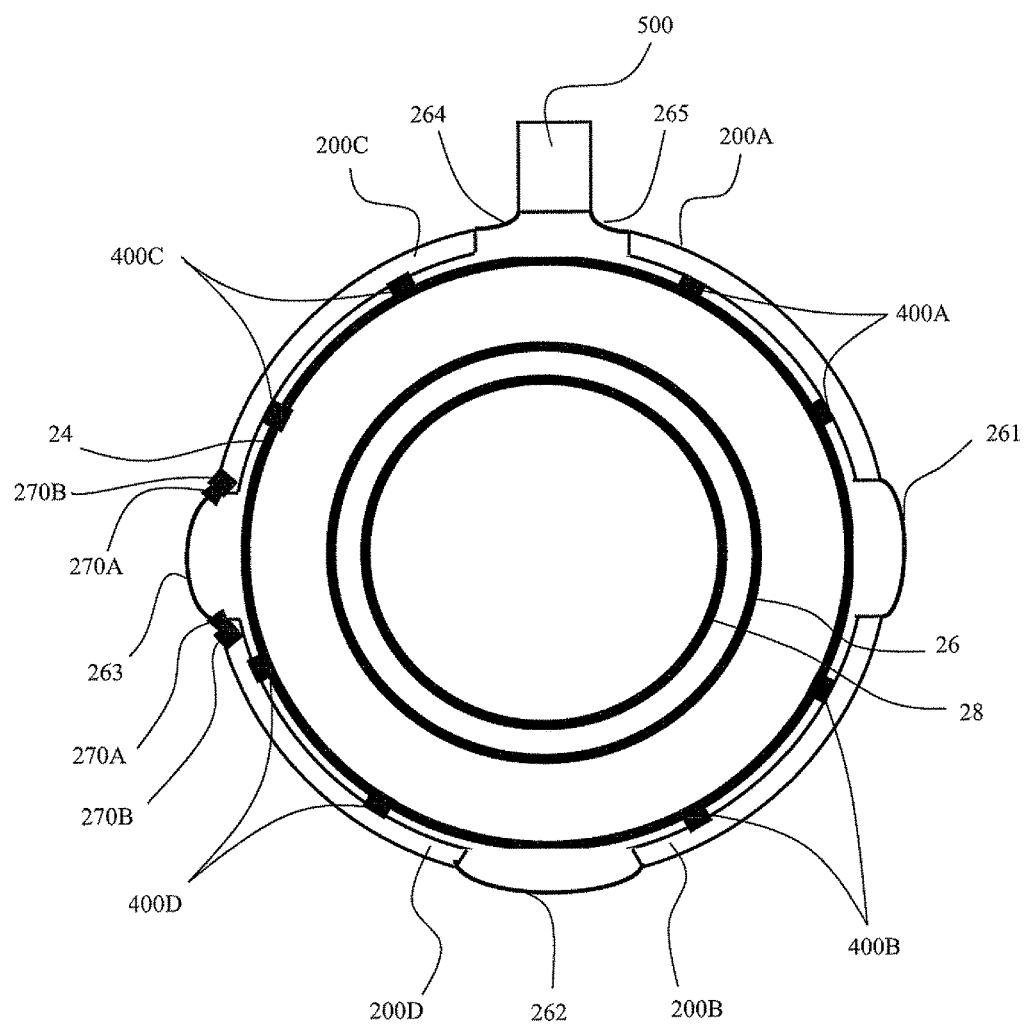
FIG. 12 shows a cross-section through a gas turbine engine according to an embodiment of the invention.

FIG. 12 is a schematic showing a cross-section perpendicular to the direction X-X of a gas turbine engine comprising electrical harness rafts. FIG. 12 shows four electrical harness rafts 200A, 200B, 200C, 200D (which may be referred to collectively as electrical harness rafts 200). Each electrical harness raft 200A, 200B, 200C, 200D comprises electrical conductors in a rigid material. For example, each electrical harness raft 200A, 200B, 200C, 200D may be as described herein, for example as described above in relation to FIGS. 3-7 in particular. Each electrical harness raft 200A, 200B, 200C, 200D is arranged (for example manufactured) to have a shape that corresponds to at least a part of the fan casing 24 of the engine 10 to which it is attached.

Each electrical harness raft 200A, 200B, 200C, 200D is, in the FIG. 12 example, connected to other components using flexible cables (which may be referred to as "flying leads") 261, 262, 263, 264, 265. The flexible cables 261, 262, 263, 264, 265 may be referred to as connection cables. The flexible cables 261, 262, 263, 264, 265 may provide electrical connection between the electrical harness rafts 200A, 200B, 200C, 200D, for example between two or more electrical harness rafts 200A, 200B, 200C, 200D and/or between electrical harness raft(s) and other components, for example other components of a gas turbine engine 10 or other components of a related structure, such as an airframe.

The flexible cables 261, 262, 263, 264, 265 may take any suitable form. For example, the flexible cables 261, 262, 263, 264, 265 may comprise a flexible printed circuit, such as the flexible printed circuit 250 described above in relation to FIGS. 8 to 11. Additionally or alternatively, the flexible cables 261, 262, 263, 264, 265 may comprise one or more conductive wires surrounded by an insulating sleeve. In the same engine installation, and indeed between two components (such as two electrical harness rafts), some flexible cables 261, 262, 263, 264, 265 may be flexible printed circuits, and others may be insulated wires.

The connection, for example the electrical connection, between a flexible cable 261, 262, 263, 264, 265 and an electrical harness raft 200 may take any suitable form. For example, an electrical harness raft 200 may be provided with an electrical connector, or socket, which is connected to (for example receives or is received by) a corresponding connector or socket of the respective flexible cable 261, 262, 263, 264, 265. A schematic example of such an arrangement is shown in FIG. 12 in relation to the flexible cable 263. The flexible cable 263 has an electrical connector 270A provided at either end. These electrical connectors 270A are connected to corresponding electrical connectors 270B in the electrical harness rafts 200C, 200D being connected together. In this way, electrical conductors 210 of the electrical harness rafts 200C, 200D may be electrically connected to the flexible cable 263, and thus to each other. The electrical connectors 270B may be provided to the electrical harness rafts 200O, 200D in any suitable manner, for example they may be embedded in the rigid material of the rafts 200C, 200D. In FIG. 12, only the connection 270A/270B between the one flexible cable 263 and two rafts 200C, 200D is shown. However, it will be appreciated that such a connection could exist between any combination of the flexible cables 261, 262, 263, 264, 265 and/or electrical harness rafts 200 and/or other components. Alternatively or additionally, and optionally on the same engine installation, other suitable connection arrangements/methods could be used to connect (for example electrically connect) such components together.

The electrical harness rafts 200 may be connected or provided to the rest of the gas turbine engine 10 in any suitable manner. In the FIG. 12 example, the electrical harness rafts 200 are connected to the gas turbine engine 10 using mounts 400 (labelled 400A-400D in FIG. 12). The mounts 400 could take any suitable form. For example, the mounts 400 in the FIG. 12 example may be anti-vibration mounts, so as to reduce/substantially eliminate the vibration transferred to the respective electrical harness raft 200. In the FIG. 12 example, each raft 200A, 200B, 200O, 200D is provided with at least two respective mounts 400A, 400B, 400O, 400D for mounting each raft 200 to the rest of the gas turbine engine 10. However, any suitable number of mounts 400 may be used as required, for example 1, 2, 3, 4, 5, 6, 7, 8, 9, 10 or more than 10 mounts 400 per raft.

One or more electrical harness rafts 200 may be provided to (for example attached to/embedded within) any part/region/component of a gas turbine engine/gas turbine engine installation 10, for example using mounts 400. In the FIG. 12 example, electrical harness rafts 200A, 200B, 200C, 200D are connected to a fan casing 24 of the gas turbine engine 10. As such, the mounts 400A, 400B, 400C, 400D may be provided between the fan casing 24 and the respective raft 200A, 200B, 200C, 200D.

Purely by way of non-limitative example only, electrical harness rafts 200 may additionally or alternatively be provided on/attached to/embedded within the engine core casing 28, the engine core fairing 26, the bifurcation between the engine core and the engine fan case (as discussed in relation to FIG. 14), nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 500 between the gas turbine engine 10 and an airframe (not shown). For the avoidance of doubt, the pylon 500, together with other connections or mounts between the gas turbine engine 10 and a connected structure (such as an airframe) may be a part of a gas turbine engine installation.

In the FIG. 12 example, two of the flexible cables 264, 265 are connected (for example electrically and/or mechanically connected) to the pylon 500. Thus, the electrical harness rafts 200 may be connected to an airframe (or aircraft, or other structure/vehicle) to which the pylon 500 is connected. The pylon 500 itself may have one or more electrical harness rafts 200 embedded therein and/or attached thereto. Additionally or alternatively, a component to which the gas turbine engine/gas turbine engine installation 10 is attached may be provided with one or more electrical harness rafts.

Figure 13:
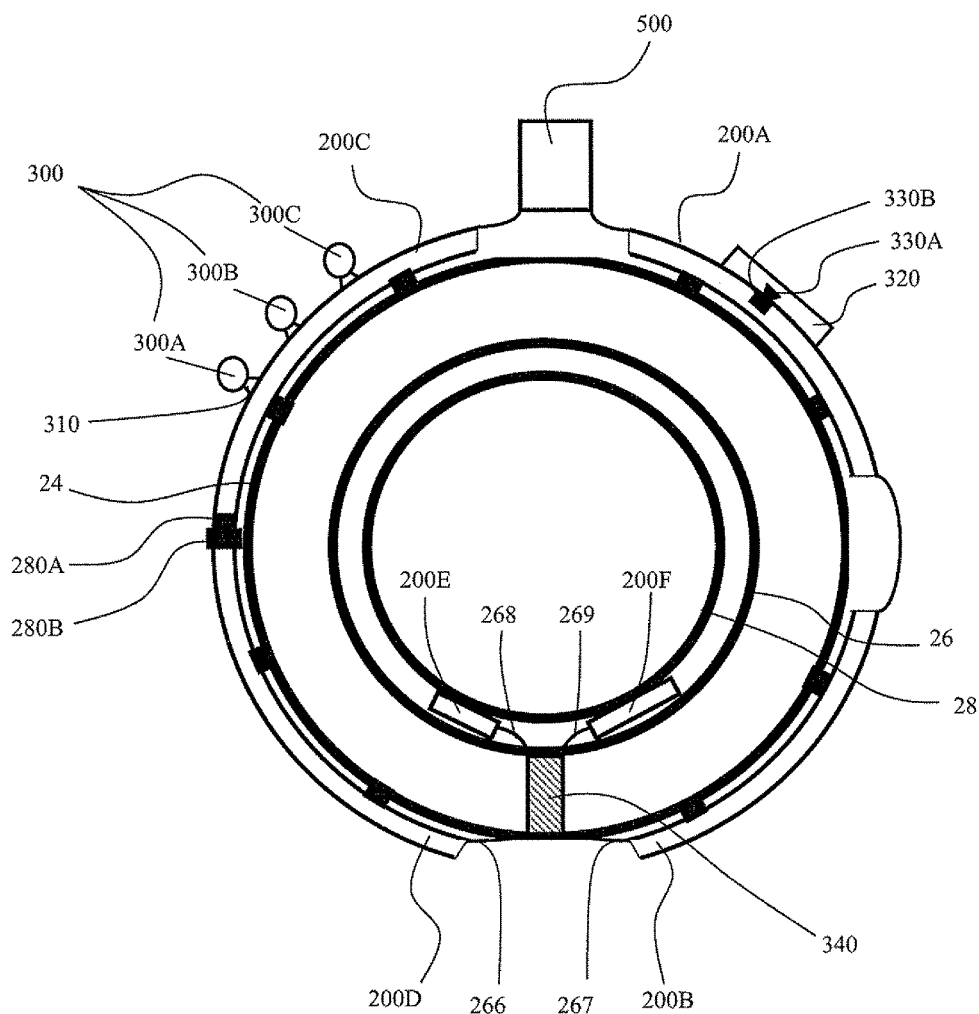
FIG. 13 shows a cross-section through a gas turbine engine according to an embodiment of the invention.

FIG. 13 is a schematic cross-section through a gas turbine engine 10 in a plane normal to the engine axis X-X. FIG. 13 is similar view to the arrangement of FIG. 12. The description of corresponding features described above in relation to FIG. 12 applies equally to the FIG. 13 example, and will not be repeated in relation to FIG. 13.

In FIG. 13, at least one of the electrical harness rafts 200 is used to mount other components/systems of the gas turbine engine 10. In general, any component/system, or a part thereof, of the gas turbine engine 10 could be mounted on/to (for example physically/mechanically mounted/connected and/or electrically connected) one or more of the electrical harness rafts 200. As discussed herein, as well as providing a particularly compact, easy to assemble and lightweight mounting solution, mounting components/systems at least in part on an electrical harness raft 200 may provide vibration isolation/damping, for example if the mounts 400 used to attach the raft 200 to the rest of the engine 10 is an anti-vibration mount.

Purely by way of non-limitative example, the components/systems mounted to the rafts 200 in the FIG. 13 example include an Electronic Engine Controller (or EEC, which may be an Electronic Control Unit, or ECU) 320 and fluid pipes 300. The EEC 320 may be used to communicate electronic signals (for example electronic control signals) with the rest of the engine, for example through the electronic harness rafts. The fluid pipes 300 may be used to transport any liquid, gas, or mixture thereof, around the gas turbine engine installation 10.

The EEC 320 may be electrically connected to the electrical harness raft 200A on which it is located in any suitable manner. For example an electrical connector 330A provided to (for example embedded in) the EEC 320 may be connected to a corresponding, or complimentary, electrical connector 330B provided to (for example embedded in) the electrical harness raft 200A. The connector 330B provided to the electrical raft harness 200A may be in electrical connection with at least some of the electrical conductors 210 embedded therein. The connector 330A provided to the EEC 320 may be in electrical connection with electrical or electronic circuits (for example control circuits) in the EEC 320. Thus, circuits in the EEC 320 can be in communication with other components through a electronic raft harness 200, thereby allowing signals (for example control/communication signals) to be transferred between the EEC 320 and the gas turbine engine installation 10 (and optionally to other components/parts to which the gas turbine engine installation is attached). The connectors 330A, 330B may take any suitable form/shape, such as that described above in relation to the connectors 270A/270B connecting the flexible cable 263 to the rafts 200C, 200D. The EEC 320 may be mechanically connected to the electrical harness raft 200A, for example by embedding the EEC 320 into the electrical harness raft 200A and/or by using suitable mounts/brackets.

As mentioned herein, the fluid pipes/conduits 300 may be used to transport any fluid around the engine as desired. FIG. 13 shows 3 pipes 300A, 300B, 300C extending in a substantially axial direction relative to the engine 10. Any number of pipes could be mounted onto a raft 200, for example 1, 2, 3, 4, 5, 6, 7, 8, 9, 10 or more than 10 pipes. Furthermore, pipes 300 could be mounted in any suitable direction, as desired. For example, in FIG. 2, pipes 300 are shown as extending circumferentially around the engine 10, whereas in FIG. 13, pipes 300 are shown extending axially along the engine 10. Each pipe 300 may be mounted in any appropriate manner, for example using a bracket. A pipe 300 on one raft 200 may be connected, for example fluidly connected, to a pipe 300 mounted on a different raft 200. Such a connection may be implemented using any suitable connector, such as a fluid-tight connector which may have portion(s) adapted to connected with complimentary portions on one, two, or more than two pipes 300.

As mentioned elsewhere herein, any suitable component/system or part thereof could be mounted on an electrical harness raft 200. Components mounted on electrical harness rafts 200 may be connected to each other, for example a component mounted on one raft 200 may be connected (for example directly electrically, mechanically and/or fluidly connected) to one or more components mounted on another raft 200. By way of non-limitative example only, an electrical harness raft 200 could be used to mount electrical cables, for example to carry electrical signals that are not carried using the conductors 210 in the electrical harness rafts 200.

In the FIG. 13 example, electrical harness rafts 200E, 200F are provided on the core casing 28. Thus, electrical harness rafts 200E, 200F are provided between the engine core casing 28 and the engine core fairing 26. Electrical signals may be passed from the electrical harness rafts 200A, 200B, 200C, 200D mounted on the fan casing 24 to the electrical harness rafts 200E, 200F mounted on the core casing 28. In the FIG. 13 example, this may be achieved by passing the electrical signals through a bifurcation or splitter 340 in the bypass duct 22, which may be formed at least in part by an outlet guide vane spanning the bypass duct 22. The bifurcation 340 may comprise, for example have embedded therein or be at least partially formed by, an electrical harness raft, such as any of the electrical harness rafts 200 described herein. Such an electrical harness raft 200 may be connected to the fan casing rafts 200D, 200B and the core casing rafts 200E, 200F using flexible cables 266, 267, 268, 269.

Connection between rafts 200A, 200B, 200C, 200D mounted on the fan casing 24 to the rafts 200E, 200F mounted on the core casing 28 may be provided at least in part by means other than an additional electrical harness raft, for example using wire conductors with insulating sleeves.

FIG. 13 also illustrates a direct connection 280A, 280B between two electrical harness rafts 200C, 200D. The direct connection may be between a connector or socket 280A provided with one raft 200C, and a complimentary connector or socket 280B provided with another raft 200D. The connectors 280A, 280B may be provided in any suitable manner, for example they may be embedded in the respective raft 200. Using direct connection between the rafts may avoid the need for flexible connecting cables 261-269 where they are not required. Thus, for example, an engine installation 10 may have some rafts 200A, 200B connected using a flexible cable 261, and other rafts 200C, 200D directly connected together.

Figure 14:
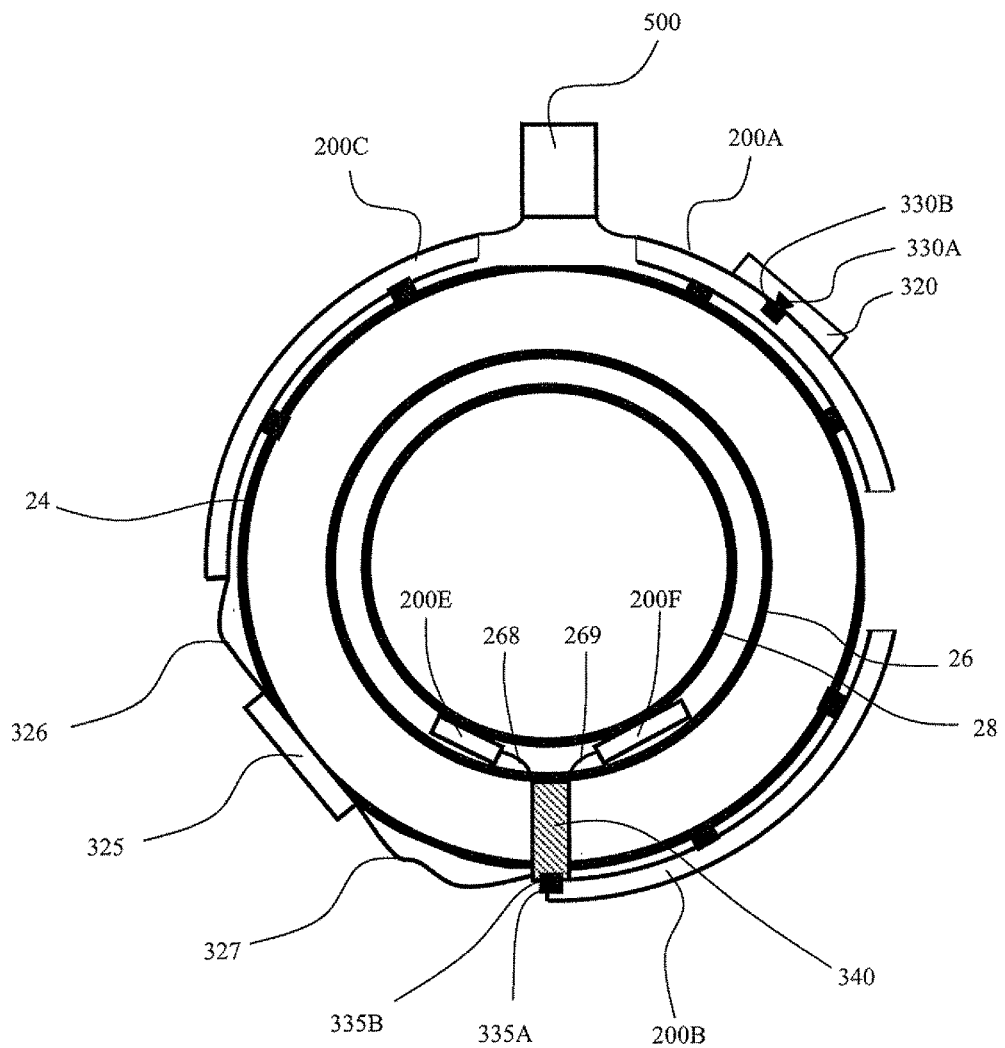
FIG. 14 shows a cross-section through a gas turbine engine according to an embodiment of the invention.

FIG. 14 is a schematic cross-section through a gas turbine engine 10 in a plane normal to the engine axis X-X. FIG. 14 is a similar view to FIGS. 12 and 13. The description of corresponding features described above in relation to FIGS. 12 and 13 applies equally to the FIG. 14 example, and will not be repeated in relation to FIG. 14.

In FIG. 14, an electrical harness raft 200C is electrically connected to an ECU 325 (which may be an EEC or an EMU, for example), using a flexible cable 326. It will be appreciated that in other embodiments, the ECU 325 may be substituted for any other component that comprises electrical conductors. The ECU 325 is electrically connected to electrical conductors in the splitter 340 via a flexible cable 327. The electrical conductors in the splitter 340 may be in the form of a splitter electrical harness raft 345, described in greater detail below in relation to FIGS. 15 and 16.

In the FIG. 14 embodiment, no two electrical harness rafts are connected together via only a flexible cable. However, this need not be the case, for example a flexible cable could be used to connect the two rafts 200A and 200B, if required.

As mentioned above, a flexible cable 327 is used to connect the ECU 325 to the electrical conductors in the splitter 340. However, alternative embodiments may have a direct (i.e. connector-to-connector) connection between the ECU 325 and the electrical conductors in the splitter 340. Such a direct connection may be similar to the direct connection between the electrical harness raft 200B and the splitter electrical harness raft 345 (see FIG. 16), in which a connector 335A embedded in the electrical harness raft 200B is directly connected to a connector 335B embedded in the splitter electrical harness raft 345.

The ECU 325 may be mounted to the rest of the gas turbine engine in any suitable manner. For example, in FIG. 14, the ECU 325 is shown as being directly connected to the fan casing 24 (for example via a mount, such as an AV mount). Other mounting methods could be used. For example, the ECU 325 could be mechanically mounted on a raft, which may be similar to the electrical harness rafts 200 other than in that it may not necessarily comprise electrical conductors. Such a mounting raft could be used to mechanically mount other systems/components (such as any components/systems described herein that could be mounted on an electrical harness raft including, by way of example only, fluid pipes) of the gas turbine engine, and may be provided anywhere on the gas turbine engine, as required.

Figure 15:
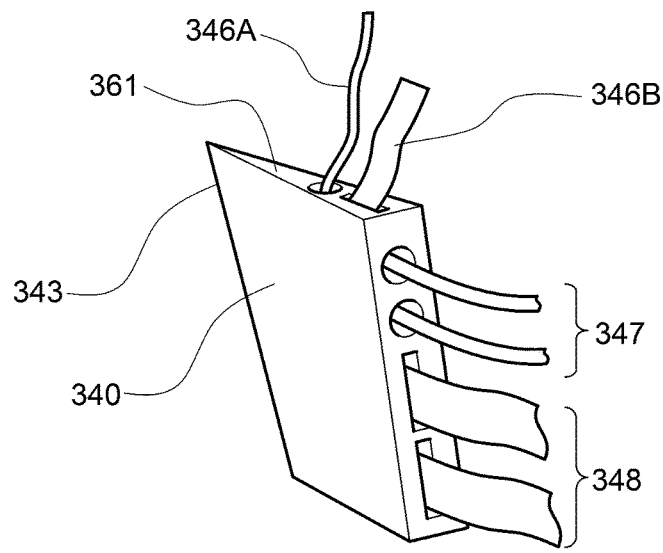
FIG. 15 shows a schematic of a splitter assembly having an electrical harness raft according to the invention.
Figure 16:
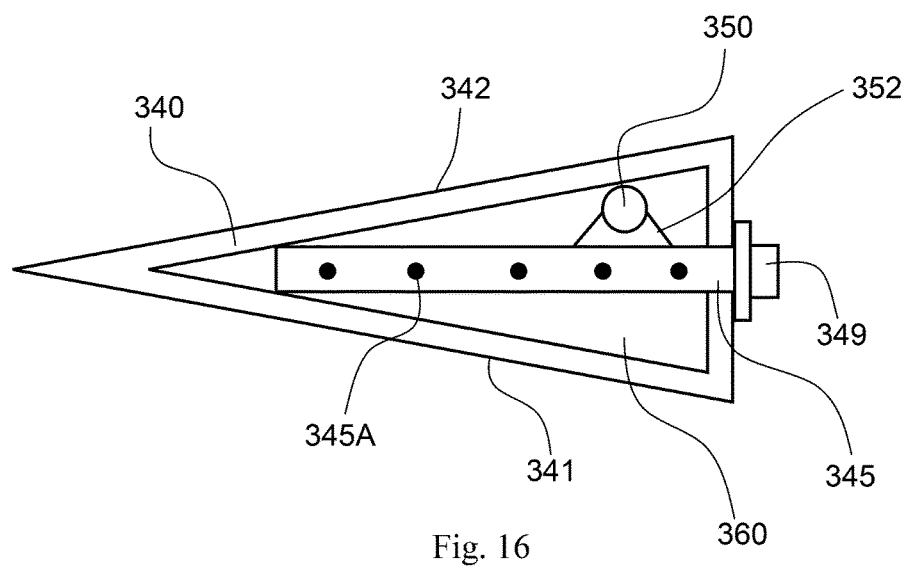
FIG. 16 shows a cross-section through a splitter assembly having an electrical harness raft according to the invention.
Figure 17:
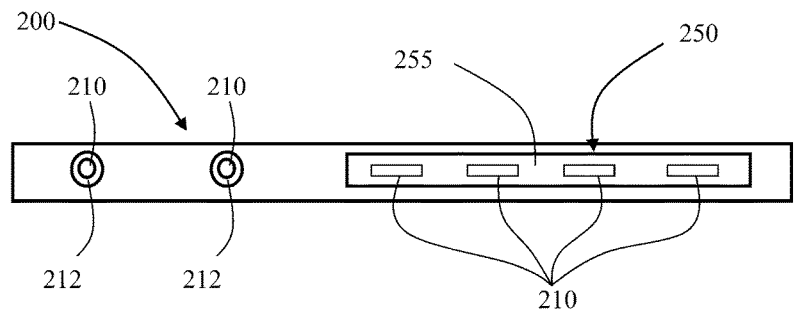
FIG. 17 shows a schematic of a cross-section through an electrical harness raft having first multiple insulated electrical conductors and second multiple electrical conductors provided in the form of a flexible printed circuit.

The splitter 340 is shown in greater detail in FIGS. 15 and 16. The splitter 340 shown in FIGS. 15 and 16 may be enclosed within a further splitter assembly, which may be referred to as a bifurcation splitter (not shown), which may be aerodynamically optimized. The further splitter assembly may comprise the external surfaces that are gas-washed by the bypass flow. Alternatively, the surfaces 341, 342 may form part of the external (gas-washed) surfaces of the splitter assembly. In that case, there would typically be an additional splitter fairing in the downstream direction, for example to enclose components, such as cables 347, 348 that are attached to the splitter electrical harness raft 345. However, such a bifurcation could be significantly smaller than a conventional bifurcation because much (or all) of the bulky electrical harness raft is no longer required, because the electrical conductors are contained in the much more compact raft 345. Furthermore, other components/systems may be more effectively packaged by mounting them on the raft 34. Thus, because the bifurcation can be made much smaller, its adverse aerodynamic impact may be reduced, and thus engine efficiency may be improved. In the FIGS. 15 and 16 example, the leading edge of the splitter 340 is the line 343 of the wedge shape, but other shapes could alternatively be used.

The splitter electrical harness raft 345 shown in FIGS. 15 and 16 has electrical conductors 345A embedded therein, which may take any suitable form, such as electrical wires and/or flexible printed circuits, as described herein in relation to the embedded electrical conductors 210. In general, features of the electrical harness rafts 200 described elsewhere herein may apply to the splitter electrical harness raft 345. The splitter electrical harness raft 345 may be connected (for example electrically connected) to any other components, for example as explained above in relation to FIG. 14. For example, connectors may be provided at radially inner and/or radially outer ends of the splitter electrical harness raft. Such connectors may be connected to other components directly or via flexible cables, as explained herein. In the FIG. 15 example, a flexible printed circuit 346B and a conventional flexible wire 346A are shown extending from a radial end of the splitter electrical harness raft 345. Further cables 347, 348 are also shown extending from the splitter electrical harness raft 345, for connection to other components. Such cables may be connected to the splitter electrical harness raft 345 using a complimentary connector connected to a connector 349, which may be embedded in the raft 345.

The splitter electrical harness raft 345 may have any other component/system, or part(s) thereof, mounted thereon. In this regard, the description provided elsewhere herein in relation to components/systems that may be mounted on electrical harness rafts 200, and the techniques/apparatus for mounting such components/systems, applies to the splitter electrical harness raft 345. By way of example only, in the FIG. 16 example, a fluid pipe 350 is shown as being mounted onto the raft 345 via a bracket 352.

Similarly, the techniques/apparatus for mounting the electrical harness rafts 200 to the rest of the gas turbine engine installation 10 described elsewhere herein may also apply to the splitter electrical harness raft 345. For example, the splitter electrical harness raft 345 may be mounted on anti-vibration (AV) mounts.

Optionally, and as shown in the FIG. 16 example, the space 360 between the splitter electrical harness raft 345 and the splitter 340 may be filled, for example using a foam, such as: polyethylene foam or polyurethane foam, reticulated foam, open cell foam, Plastazote® (from Zotefoams®), high density closed cell polyethylene foam, visco elastic memory foam, flame retardant foam. Such foam may provide protection to the splitter electrical harness raft 345, for example from vibration, and/or fire protection.

Optionally, the splitter 340 that contains an electrical harness raft may act as (or may be) a firewall. For example, a fireproof coating and/or material may be provided around at least a part of the boundary of the splitter 340, for example at the inner and/or outer radial end surfaces. Referring to FIG. 15, the outer radial surface 361 may be fireproofed in this way. Accordingly, the splitter 340 may form at least a part of a fireproof boundary between an engine core fire zone and a fan case fire zone. The engine core fire zone may be between the engine core casing 28 and the engine core fairing 26. The fan case fire zone may be between the fan casing 24 and the nacelle. It may be necessary and/or desirable to isolate the fan case fire zone from the engine core fire zone so as to prevent fire crossing therebetween.

Conventionally, a firewall may extend across a conventional bifurcation and splitter assembly. Using the splitter 340 according to the invention as at least a part of a fire boundary may reduce the size (and thus weight) of the required additional firewall through the bifurcation and/or substantially eliminate the need for a separate firewall.

The splitter assembly, including the splitter electrical harness raft 345, may contain any or all of the components/systems that would usually pass through a conventional splitter. However, by using a raft harness, the size and weight may be reduced. Additionally or alternatively, the whole splitter assembly may become a "cassette" that can more readily be disconnected, removed, and/or replaced, for example during maintenance.

Where reference is made herein to a gas turbine engine installation, it will be appreciated that this term may include a gas turbine engine and optionally any peripheral components to which the gas turbine engine may be connected to or interact with and/or any connections/interfaces with surrounding components, which may include, for example, an airframe and/or components thereof. Such connections with an airframe, which are encompassed by the term 'gas turbine engine installation' as used herein include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application.

It will be appreciated that many alternative configurations and/or arrangements of electrical harness rafts 200 and gas turbine engines comprising electrical harness rafts 200 other than those described herein may fall within the scope of the invention. For example, alternative arrangements of electrical harness rafts 200 (for example in terms of construction, layout and/or shape of conductors 210 and/or rigid material 220 and/or the resulting raft 200) may fall within the scope of the invention and may be readily apparent to the skilled person from the disclosure provided herein. Alternative arrangements of connections between the rafts 200 and between the rafts 200 other components may fall within the scope of the invention and may be readily apparent to the skilled person from the disclosure provided herein. Furthermore, any feature described and/or claimed herein may be combined with any other compatible feature described in relation to the same or another embodiment.

We claim:

1. A gas turbine engine installation comprising an electrical system arranged to transfer electrical signals around the engine installation, the electrical system comprising:
    an electrical harness raft comprising first multiple insulated electrical conductors and second multiple electrical conductors, the first multiple insulated electrical conductors being integrally embedded in a rigid material so as to be surrounded by and fixed in position by the rigid material such that the rigid material directly contacts the first multiple insulated electrical conductors consistently along the outer surfaces of the entire lengths of the first multiple insulated electrical conductors, the second multiple electrical conductors being provided in a flexible printed circuit that is embedded in the rigid material, the electrical harness raft forming a first engine installation component;
    a second engine installation component comprising electrical conductors; and
    at least one flexible cable connected between the electrical harness raft and the second engine installation component so as to electrically connect the first multiple insulated electrical conductors and/or the second multiple electrical conductors of the electrical harness raft with the electrical conductors of the second engine installation component,
    the electrical harness raft having embedded therein at least one electrical connector, the at least one electrical connector being in electrical contact with at least one of the first multiple insulated electrical conductors embedded in the rigid material and having terminals for connection with a complimentary connector, the flexible cable comprising the complimentary connector that is connected to the corresponding electrical connector embedded in the electrical harness raft.

2. The gas turbine engine installation according to claim 1, wherein
    the rigid material is a rigid composite material.

3. The gas turbine engine installation according to claim 1, wherein
    the second engine component is a second electrical harness raft comprising further electrical conductors embedded in a rigid material.

4. The gas turbine engine installation according to claim 1, wherein
    the second engine component is an electronic control unit.

5. The gas turbine engine installation according to claim 1, wherein:
    the gas turbine engine installation comprises a bypass flow duct formed between an engine core and an engine fan casing; and
    the electrical harness raft forms at least a part of a radially extending splitter that extends across the bypass flow duct.

6. The gas turbine engine installation according to claim 1, wherein
    at least one of the first multiple insulated electrical conductors comprises an electrically conductive wire.

7. The gas turbine engine installation according to claim 1, wherein
    the at least one flexible cable comprises at least one of:
    a flexible printed circuit having electrically conductive tracks in a substrate; and
    an electrically insulated conductive wire.

8. The gas turbine engine installation according to claim 1, further comprising
    at least one fluid pipe mounted on the electrical harness raft and/or at least one electronic control unit mounted on the electrical harness raft, the electronic control unit optionally being electrically connected to one or more of the first multiple insulated electrical conductors and/or the second multiple electrical conductors in the electrical harness raft on which the electronic control unit is mounted using second complimentary electrical connectors provided in the electronic control unit and the electrical harness raft.

9. The gas turbine engine installation according to claim 1, further comprising
    at least one anti-vibration mount through which the electrical harness raft is attached to the rest of the gas turbine installation.

10. The gas turbine engine installation according to claim 1, further comprising
    a fan casing on which the electrical harness raft is mounted.

11. The gas turbine engine installation according to claim 10 comprising
    at least one additional electrical harness raft, wherein the electrical harness raft and the additional electrical harness raft are shaped to correspond to a portion of an outer surface of the fan casing to which they are mounted, such that the fan casing is at least partially surrounded by the electrical harness raft and the additional electrical harness raft.

12. The gas turbine engine installation according to claim 1, wherein
    the first multiple insulated electrical conductors and the second multiple electrical conductors are embedded in the rigid material such that the rigid material surrounds the first multiple insulated electrical conductors and the second multiple electrical conductors along an entire length of the first multiple insulated electrical conductors and the second multiple electrical conductors.

13. A method of assembling a gas turbine engine installation comprising:
    installing an electrical harness raft having first multiple insulated electrical conductors and second multiple electrical conductors, the first multiple insulated electrical conductors being arranged to transfer electrical signals around the engine and being integrally embedded in a rigid material so as to be surrounded by and fixed in position by the rigid material such that the rigid material directly contacts the first multiple insulated electrical conductors consistently along the outer surfaces of the entire lengths of the first multiple insulated electrical conductors, the second multiple electrical conductors being provided in a flexible printed circuit that is embedded in the rigid material; and connecting a flexible cable between the electrical harness raft and another engine installation component comprising electrical conductors, so as to electrically connect the first multiple insulated electrical conductors and/or the second multiple electrical conductors of the electrical harness raft with the electrical conductors of the other engine installation component, the electrical harness raft having embedded therein at least one electrical connector, the at least one electrical connector being in electrical contact with at least one of the first multiple insulated electrical conductors embedded in the rigid material and having terminals for connection with a complimentary connector, the flexible cable comprising the complimentary connector that is connected to the corresponding electrical connector embedded in the electrical harness raft.

14. The method of assembling the gas turbine engine installation according to claim 13, wherein the first multiple insulated electrical conductors and the second multiple electrical conductors are embedded in the rigid material such that the rigid material surrounds the first multiple insulated electrical conductors and the second multiple electrical conductors along an entire length of the first multiple insulated electrical conductors and the second multiple electrical conductors.

* * * * *